(12) United States Patent
Li et al.

(10) Patent No.: US 12,314,084 B2
(45) Date of Patent: May 27, 2025

(54) DISPLAY MODULE WITH A BENDABLE REGION AND NON-BENDABLE REGION, AND ELECTRONIC DEVICE

(71) Applicant: Huawei Technologies Co., Ltd., Shenzhen (CN)

(72) Inventors: Qiang Li, Shanghai (CN); Tao Sun, Dongguan (CN); Haochun Zang, Shanghai (CN); Kun Lv, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 140 days.

(21) Appl. No.: 17/759,243

(22) PCT Filed: Jan. 13, 2021

(86) PCT No.: PCT/CN2021/071362
§ 371 (c)(1),
(2) Date: Jul. 21, 2022

(87) PCT Pub. No.: WO2021/147714
PCT Pub. Date: Jul. 29, 2021

(65) Prior Publication Data
US 2023/0070431 A1 Mar. 9, 2023

(30) Foreign Application Priority Data
Jan. 22, 2020 (CN) .......................... 202020146584.4

(51) Int. Cl.
*G06F 1/16* (2006.01)

(52) U.S. Cl.
CPC .......... *G06F 1/1656* (2013.01); *G06F 1/1616* (2013.01); *G06F 1/1652* (2013.01); *G06F 1/1681* (2013.01)

(58) Field of Classification Search
CPC .... G06F 1/1652; G06F 1/1616; G06F 1/1637; G06F 1/1641; H05K 5/0217;
(Continued)

(56) References Cited

U.S. PATENT DOCUMENTS

2016/0357052 A1* 12/2016 Kim .................. G02F 1/133308
2018/0032107 A1 2/2018 Cho et al.
(Continued)

FOREIGN PATENT DOCUMENTS

CN 205881905 U 1/2017
CN 208141720 U 11/2018
(Continued)

*Primary Examiner* — James Wu
*Assistant Examiner* — Dakota M Talbert
(74) *Attorney, Agent, or Firm* — Slater Matsil, LLP

(57) ABSTRACT

A display module and an electronic device are provided. The display module includes a display and a support. The display includes a first non-bending region, a bending region, and a second non-bending region. The support is fastened to a non-display side of the display. The support includes a first metal plate, a third metal plate, a second metal plate, and a first buffer. The first metal plate is disposed facing the first non-bending region. The second metal plate is disposed facing the second non-bending region. The third metal plate is disposed facing the bending region, and the third metal plate can be bent. The first buffer is located between the first metal plate and the second metal plate.

12 Claims, 12 Drawing Sheets

(58) Field of Classification Search
CPC ... H05K 2201/10128; H05K 2201/056; H05K 1/056; H04M 1/0268
See application file for complete search history.

(56) References Cited

U.S. PATENT DOCUMENTS

| | | | |
|---|---|---|---|
| 2018/0122830 A1* | 5/2018 | Kachatryan | B32B 27/286 |
| 2018/0192527 A1 | 7/2018 | Yun et al. | |
| 2019/0036068 A1* | 1/2019 | Kim | G06F 1/1601 |
| 2019/0141843 A1 | 5/2019 | Park et al. | |
| 2019/0204867 A1 | 7/2019 | Song et al. | |
| 2019/0361285 A1* | 11/2019 | Wang | G09F 9/301 |
| 2021/0217975 A1* | 7/2021 | Gu | H10K 77/111 |

FOREIGN PATENT DOCUMENTS

| | | |
|---|---|---|
| CN | 109545087 A | 3/2019 |
| CN | 208607861 U | 3/2019 |
| CN | 110010000 A | 7/2019 |
| CN | 110277022 A | 9/2019 |
| CN | 110400520 A | 11/2019 |
| CN | 211455154 U | 9/2020 |
| CN | 211455155 U | 9/2020 |
| CN | 211455156 U | 9/2020 |
| WO | 2017113243 A1 | 7/2017 |

* cited by examiner

DISPLAY MODULE WITH A BENDABLE REGION AND NON-BENDABLE REGION, AND ELECTRONIC DEVICE

CROSS-REFERENCE TO RELATED APPLICATIONS

This application is a National Stage of International Application No. PCT/CN2021/071362, filed on Jan. 13, 2021, which claims priority to Chinese Patent Application No. 202020146584.4, filed on Jan. 22, 2020. Both of the aforementioned applications are hereby incorporated by reference in their entireties.

TECHNICAL FIELD

This application relates to the field of electronic device technologies, and in particular, to a display module and an electronic device.

BACKGROUND

A flexible display has advantages of being light, thin, non-fragile, and foldable and rollable. Therefore, the flexible display is widely used in electronic products such as a mobile phone. However, in a conventional mobile phone, hardness of a flexible display is poor, and a surface collapse phenomenon is prone to occur. Therefore, a support sheet is disposed at the bottom of the conventional flexible display to support the flexible display, so that a surface collapse problem of the flexible display is resolved. However, when the support sheet is thick, the support sheet restricts the flexible display from bending, and it is difficult for the mobile phone to be folded. When the support sheet is thin, although the support sheet does not restrict the flexible display from bending, the excessively thin support sheet does not have sufficient structural strength, and therefore cannot support the flexible display well.

SUMMARY

This application provides a display module and an electronic device that are foldable and have sufficient support strength.

According to a first aspect, this application provides a display module. The display module includes a display and a support. The display includes a first non-bending region, a bending region, and a second non-bending region that are successively connected. In other words, the bending region is connected between the first non-bending region and the second non-bending region. The support is fastened to a non-display side of the display. The support includes a first metal plate, a third metal plate, and a second metal plate that are successively connected. In other words, the third metal plate is connected between the first metal plate and the second metal plate. The first metal plate is disposed facing the first non-bending region. The second metal plate is disposed facing the second non-bending region. The third metal plate is disposed facing the bending region, and the third metal plate can be bent.

The support further includes a first buffer. The first buffer is located between the first metal plate and the second metal plate, and the first buffer and the third metal plate are disposed in a stacked manner. The third metal plate is provided with a plurality of through holes. The plurality of through holes penetrate through the third metal plate in a thickness direction of the display module. The plurality of through holes are hollowed out. It may be understood that, hollow-out means that the through hole is not filled with another material, that is, the through hole is filled with air. Certainly, because the first buffer is fastened to a first surface, and the first buffer is elastic, when an electronic device is unfolded or folded, a small portion of the first buffer may be allowed to be squeezed into the through hole.

In this implementation, the third metal plate is provided with the plurality of through holes, so that the third metal plate has better flexibility. In this case, in a process of unfolding or folding the electronic device, the third metal plate can absorb stress in a bending process, so that impact of the third metal plate on the display in the bending process is reduced.

In addition, a first support plate, a second support plate, and a third support plate of a rotation apparatus are generally provided with a plurality of through holes or grooves. The through hole or the groove may be used as a shelter or configured to lock a fastener. In this case, when the electronic device is in an unfolded state, peripheral edges of the grooves or the through holes on the first support plate, the second support plate, and the third support plate of the rotation apparatus are prone to squeeze the third metal plate. Because stress on the peripheral edges of the through holes of the third metal plate is concentrated, the peripheral edges of the through holes can squeeze an optical clear adhesive with a large squeezing force. In this case, the optical clear adhesive protrudes, so that a problem such as a black spot or a bright line is prone to occur on the display. However, in this implementation, the first buffer is fastened between the third metal plate and the display, so that when the peripheral edges of the grooves or the through holes on the first support plate, the second support plate, and the third support plate squeeze the third metal plate, the third metal plate can transfer squeezing force to the first buffer. In this case, the first buffer has sufficient flexibility to absorb a portion of the squeezing force, so as to reduce force with which the peripheral edges of the through holes of the third metal plate squeeze the display. Therefore, the problem such as the black spot or the bright line due to excessive squeezing is prevented, to a large degree, from occurring on the display.

In addition, when the peripheral edges of the grooves or the through holes on the first support plate, the second support plate, and the third support plate squeeze the third metal plate, if the third metal plate breaks, the peripheral edges squeeze towards the display. In this case, the first buffer can also prevent the broken third metal plate from directly piercing or squeezing towards the display. Therefore, the problem such as the black spot or the bright line is prevented, to a large degree, from occurring on the display.

In addition, in this embodiment, hardness and stiffness of the first metal plate and the second metal plate are high. In this case, in the process of unfolding or folding the electronic device, the first metal plate has better hardness and stiffness to support the first non-bending region of the display, and the second metal plate has better hardness and stiffness to support the second non-bending region of the display. Therefore, the display is prevented from collapsing, that is, it is ensured that the display module has better surface flatness.

In addition, the first metal plate, the third metal plate, the second metal plate, and the first buffer can form an integral component (the support). In this case, a manner in which the support as the integral component is mounted on the display is simple, namely, an assembly manner of the display module can be simplified.

In an implementation, the first buffer is an adhesive tape. The first buffer is bonded to a surface that is of the third metal plate and that faces the display. It may be understood that the adhesive tape may be either a single-sided tape, or a double-sided tape.

In this implementation, because the first buffer may be bonded, a manner of fastening the first buffer to the third metal plate is simple and easy to operate. In addition, compared with a solution in which the first buffer is fastened to the third metal plate through a fastener adhesive, the fastener adhesive is omitted in this implementation. Therefore, input costs of the support can be reduced.

In an implementation, one side of the first buffer is connected to the first metal plate, and the other side is connected to the second metal plate. In this case, a gap no longer exists between the first buffer and the first metal plate, and a gap no longer exists between the first buffer and the second metal plate either. Therefore, a surface that is of the support and that faces the display is flat. In this case, there are few stress concentration regions on the support, so that in the process of unfolding or folding the electronic device, some regions of the support are prevented from excessively squeezing the display due to stress concentration.

In an implementation, the first buffer is an adhesive tape. The first buffer is bonded to a surface that is of the third metal plate and that is away from the display.

In this implementation, because the first buffer may be bonded, a manner of fastening the first buffer to the third metal plate is simple and easy to operate. In addition, compared with a solution in which the first buffer is fastened to the third metal plate through a fastener adhesive, the fastener adhesive is omitted in this implementation. Therefore, input costs of the support can be reduced.

In an implementation, the support further includes a second buffer. The second buffer is fastened to a surface that is of the third metal plate and that is away from the first buffer. In other words, when the first buffer is fastened to the surface that is of the third metal plate and that faces the display, the second buffer is fastened to the surface that is of the third metal plate and that is away from the display. Alternatively, when the first buffer is fastened to the surface that is of the third metal plate and that is away from the display, the second buffer is fastened to the surface that is of the third metal plate and that faces the display.

It may be understood that the first buffer and the second buffer are disposed on two surfaces that are of the third metal plate and that are disposed opposite to each other, so that flexibility of the support disposed in the bending region facing the display is significantly improved. In this case, in the process of unfolding or folding the electronic device, the support disposed facing the bending region can reduce impact on the display in the bending process. In other words, in the process of unfolding or folding the electronic device, the first buffer and the second buffer can jointly absorb stress generated during bending.

In addition, when the first buffer is fastened to the surface that is of the third metal plate and that faces the display, the second buffer is fastened to the surface that is of the third metal plate and that is away from the display, so that when the electronic device is in an unfolded state, the peripheral edges of the grooves or the through holes on the first support plate, the second support plate, and the third support plate of the rotation apparatus squeeze the second buffer. In this way, because the second buffer has better flexibility, the second buffer has sufficient flexibility to absorb a portion of squeezing force. In this case, the stress on the peripheral edges of the through holes of the third metal plate is not concentrated, in other words, force with which the peripheral edges of the through holes of the third metal plate squeeze the display is small. Therefore, a problem such as a black spot or a bright line is prevented, to a large degree, from occurring on the display. In addition, when the second buffer transfers a portion of the squeezing force to the first buffer through the third metal plate, the first buffer can also absorb a portion of the squeezing force again. In this case, large squeezing force exerted on the display is further reduced. Therefore, the problem such as the black spot or the bright line is prevented, to a large degree, from occurring on the display.

In an implementation, the plurality of through holes form a plurality of first through hole groups. The plurality of first through hole groups are arranged in a first direction. Each first through hole group includes a plurality of first through holes. A plurality of first through holes in a same first through hole group are arranged at intervals in a second direction. A plurality of first through holes in two adjacent first through hole groups are arranged to cover partly with each other. The second direction is a direction in which the first metal plate faces the second metal plate, and the first direction is perpendicular to the second direction. For example, the first direction may be a width direction of the electronic device, namely, the X-axis direction. The second direction may be a length direction of the electronic device, namely, the Y-axis direction.

In this implementation, the first through hole group is disposed on a metal part, so that overall flexibility of a first connection plate can be improved to ensure that the display module has better flexibility. In this case, in the process of unfolding or folding the electronic device, the first through hole group of the first connection plate can effectively absorb bending force. Therefore, the first connection plate is prevented from generating impact on bending of the display.

In an implementation, the first through hole is a strip-shaped hole. An extension direction of the first through hole is parallel to the first direction. A width of the first through hole in the second direction ranges from 0.15 millimeter to 3 millimeters.

In this implementation, when the extension direction of the first through hole is parallel to the X-axis direction, and the width d1 of the first through hole in the Y-axis direction ranges from 0.15 millimeter to 3 millimeters, an area that is of a hollow-out region formed by the third metal plate and that is on an X-Y plane is large. In this case, in the process of unfolding or folding the electronic device, the first through hole can absorb stress of the display module in the bending process. In other words, this avoids that the display is not easily bent due to excessive stress of the third metal plate. Therefore, a bending effect of the display module is improved.

In an implementation, in the second direction, a distance between two adjacent first through holes in the same first through hole group ranges from 0.05 millimeter to 0.8 millimeter. In this case, the third metal plate not only has better hardness and stiffness, but also has better flexibility.

In an implementation, in a thickness direction of the display module, a height of the third metal plate ranges from 0.015 millimeter to 0.3 millimeter. In this way, the hardness and the stiffness of the third metal plate are ensured, and the flexibility of the third metal plate is better. In other words, the hardness and the stiffness of the third metal plate are moderate.

In an implementation, the support further includes a fourth metal plate, a fifth metal plate, and a third buffer that face the bending region of the display. The first metal plate, the fourth metal plate, the fifth metal plate, the third metal plate, and the second metal plate are successively connected. The fourth metal plate can be bent. The fourth metal plate is provided with the through hole. The third buffer is located between the first metal plate and the fifth metal plate, and the third buffer and the fourth metal plate are disposed in a stacked manner. It may be understood that the third buffer may be fastened to a surface that is of the fourth metal plate and that faces the display, or may be fastened to a surface that is of the fourth metal plate and that is away from the display.

In this implementation, because the fourth metal plate is provided with the through hole, overall hardness and stiffness of the fourth metal plate are moderate. In addition, the third buffer is disposed on the fourth metal plate in a stacked manner. In this case, flexibility of some regions of the support can be improved through cooperation between the fourth metal plate and the third buffer. In this case, a quantity of regions of the support that have better flexibility may increase. Therefore, when the support is fastened to the display, the fourth metal plate may alternatively be fastened to a region with a larger bending angle in the bending region of the display, to ensure that the bending region of the display has a better bending effect.

According to a second aspect, this application provides a display module. The display module includes a display and a support. The display includes a first non-bending region, a bending region, and a second non-bending region that are successively connected. In other words, the bending region is connected between the first non-bending region and the second non-bending region. The support is fastened to a non-display side of the display. The support includes a first metal plate, a third metal plate, and a second metal plate that are successively connected. In other words, the third metal plate is connected between the first metal plate and the second metal plate. The first metal plate is disposed facing the first non-bending region. The second metal plate is disposed facing the second non-bending region. The third metal plate is disposed facing the bending region.

The third metal plate is a continuous and complete plate, and the third metal plate can be bent. In other words, the third metal plate is not provided with a through hole or a groove. In this case, a first surface of the third metal plate is a flat surface. In a thickness direction of the display module, a height of the third metal plate ranges from 0.015 millimeter to 0.3 millimeter. A height of the first metal plate and a height of the second metal plate range from 0.1 millimeter to 0.5 millimeter.

The support further includes a first buffer. The first buffer is located between the first metal plate and the second metal plate, and the first buffer and the third metal plate are disposed in a stacked manner. It may be understood that the first buffer may be fastened to a surface that is of the third metal plate and that faces the display, or may be fastened to a surface that is of the third metal plate and that is away from the display.

In this implementation, a height H1 of the third metal plate is set to be within a range from 0.015 millimeter to 0.3 millimeter, so that the third metal plate has better flexibility. In this case, in the process of unfolding or folding the electronic device, internal stress of the third metal plate is not concentrated, so that impact on bending of the display is reduced.

In addition, the first buffer is fastened to the surface that is of the third metal plate and that faces the display, so that when the peripheral edges of the grooves or the through holes on the first support plate, the second support plate, and the third support plate squeeze the third metal plate, the third metal plate transfers squeezing force to the first buffer. In this case, the first buffer may absorb a portion of the squeezing force, to prevent the problem such as the black spot or the bright line due to excessive squeezing from occurring on the display.

In addition, when the peripheral edges of the grooves or the through holes on the first support plate, the second support plate, and the third support plate squeeze the third metal plate, if the third metal plate breaks, the peripheral edges squeeze towards the display. In this case, the first buffer can also prevent the broken third metal plate from directly piercing or squeezing towards the display. Therefore, the problem such as the black spot or the bright line is prevented, to a large degree, from occurring on the display.

In addition, in the Z direction, a height H2 of the first metal plate and a height H3 of the second metal plate range from 0.1 millimeter to 0.5 millimeter. In this way, the first metal plate and the second metal plate have sufficient hardness and stiffness, so that in the process of unfolding or folding the electronic device, the first metal plate and the second metal plate can effectively support the display. In addition, the first metal plate and the second metal plate in this size are thin, so that the first metal plate and the second metal plate do not increase the thickness of the display module to a large degree either.

In an implementation, the first buffer is an adhesive tape. The first buffer is bonded to a surface that is of the third metal plate and that faces the display. It may be understood that the adhesive tape may be either a single-sided tape, or a double-sided tape.

In this implementation, because the first buffer may be bonded, a manner of fastening the first buffer to the third metal plate is simple and easy to operate. In addition, compared with a solution in which the first buffer is fastened to the third metal plate through a fastener adhesive, the fastener adhesive is omitted in this implementation. Therefore, input costs of the support can be reduced.

In an implementation, one side of the first buffer is connected to the first metal plate, and the other side is connected to the second metal plate. In this case, a gap no longer exists between the first buffer and the first metal plate, and a gap no longer exists between the first buffer and the second metal plate either. Therefore, a surface that is of the support and that faces the display is flat. In this case, there are few stress concentration regions on the support, so that in the process of unfolding or folding the electronic device, some regions of the support are prevented from excessively squeezing the display due to stress concentration.

In an implementation, the first buffer is an adhesive tape. The first buffer is bonded to a surface that is of the third metal plate and that is away from the display. It may be understood that the adhesive tape may be either a single-sided tape, or a double-sided tape.

In this implementation, because the first buffer may be bonded, a manner of fastening the first buffer to the third metal plate is simple and easy to operate. In addition, compared with a solution in which the first buffer is fastened to the third metal plate through a fastener adhesive, the fastener adhesive is omitted in this implementation. Therefore, input costs of the support can be reduced.

In an implementation, the support further includes a second buffer. The second buffer is fastened to a surface that is of the third metal plate and that is away from the first buffer. In other words, when the first buffer is fastened to the surface that is of the third metal plate and that faces the display, the second buffer is fastened to the surface that is of the third metal plate and that is away from the display.

Alternatively, when the first buffer is fastened to the surface that is of the third metal plate and that is away from the display, the second buffer is fastened to the surface that is of the third metal plate and that faces the display.

It may be understood that the first buffer and the second buffer are disposed on two surfaces that are of the third metal plate and that are disposed opposite to each other, so that flexibility of the support disposed in the bending region facing the display is significantly improved. In this case, in the process of unfolding or folding the electronic device, the support disposed facing the bending region can reduce impact on the display in the bending process. In other words, in the process of unfolding or folding the electronic device, the first buffer and the second buffer can jointly absorb stress generated during bending.

In addition, when the first buffer is fastened to the surface that is of the third metal plate and that faces the display, the second buffer is fastened to the surface that is of the third metal plate and that is away from the display, so that when the electronic device is in an unfolded state, the peripheral edges of the grooves or the through holes on the first support plate, the second support plate, and the third support plate of the rotation apparatus squeeze the second buffer. In this way, because the second buffer has better flexibility, the second buffer has sufficient flexibility to absorb a portion of squeezing force. In this case, the stress on the peripheral edges of the through holes of the third metal plate is not concentrated, in other words, force with which the peripheral edges of the through holes of the third metal plate squeeze the display is small. Therefore, the problem such as the black spot or the bright line is prevented, to a large degree, from occurring on the display. In addition, when the second buffer transfers a portion of the squeezing force to the first buffer through the third metal plate, the first buffer can also absorb a portion of the squeezing force again. In this case, large squeezing force exerted on the display is further reduced. Therefore, the problem such as the black spot or the bright line is prevented, to a large degree, from occurring on the display.

In an implementation, the support further includes a fourth metal plate, a fifth metal plate, and a third buffer that face the bending region of the display. The first metal plate, the fourth metal plate, the fifth metal plate, the third metal plate, and the second metal plate are successively connected. The fourth metal plate can be bent. In a thickness direction of the display module, a height of the fourth metal plate ranges from 0.015 millimeter to 0.3 millimeter, and a height H5 of the fifth metal plate ranges from 0.1 millimeter to 0.5 millimeter. The third buffer is located between the first metal plate and the fifth metal plate, and the third buffer and the fourth metal plate are disposed in a stacked manner. It may be understood that the third buffer may be fastened to a surface that is of the fourth metal plate and that faces the display, or may be fastened to a surface that is of the fourth metal plate and that is away from the display.

In this implementation, because the height of the fourth metal plate ranges from 0.015 millimeter to 0.3 millimeter, overall hardness and stiffness of the fourth metal plate are moderate. In addition, the third buffer is disposed on the fourth metal plate in a stacked manner. In this case, flexibility of some regions of the support can be improved through cooperation between the fourth metal plate and the third buffer. In this case, a quantity of regions of the support that have better flexibility may increase. Therefore, when the support is fastened to the display, the fourth metal plate may alternatively be fastened to a region with a larger bending angle in the bending region of the display, to ensure that the bending region of the display has a better bending effect.

According to a third aspect, this application provides an electronic device. The electronic device includes a housing and the foregoing display module. The display module is mounted in the housing.

In this implementation, the display module is foldable and has sufficient support strength. When the display module is applied to an electronic device, the electronic device is also foldable and has sufficient support strength.

DETAILED DESCRIPTION OF ILLUSTRATIVE EMBODIMENTS

Figure 1:
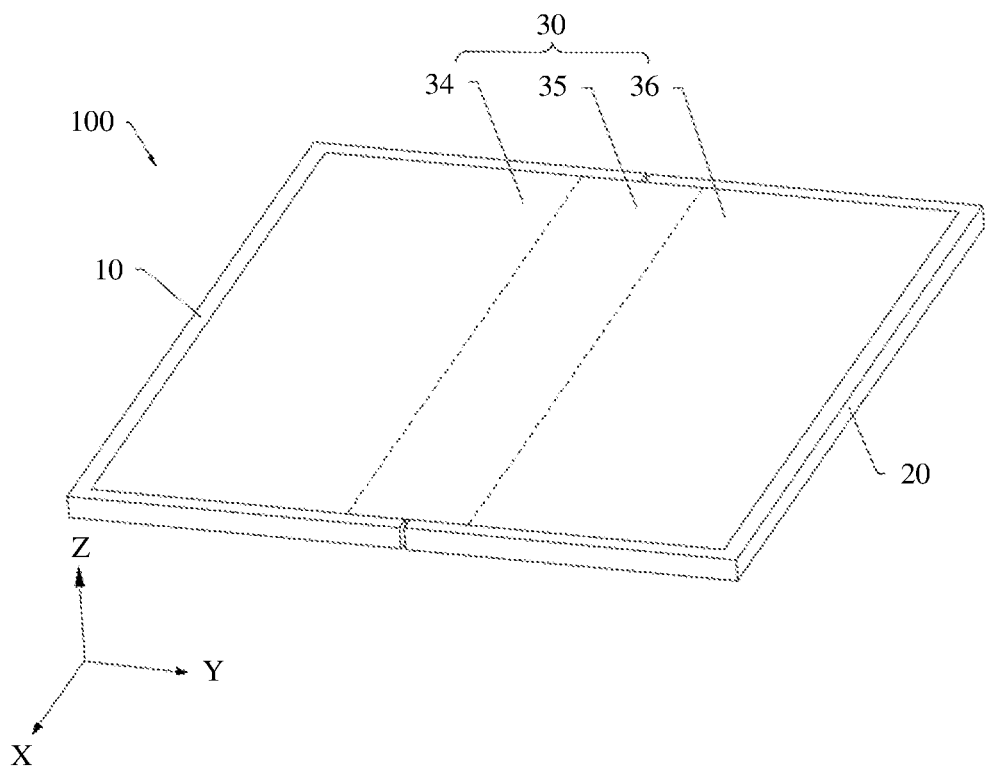
FIG. 1 is a schematic diagram of a structure of an electronic device in an unfolded state according to an embodiment of this application.

FIG. 1 is a schematic diagram of a structure of an electronic device in an unfolded state according to an embodiment of this application. An electronic device 100 may be a tablet computer, a mobile phone, a camera, a personal computer, a notebook computer, an in-vehicle device, or a wearable device. In the embodiment shown in FIG. 1, descriptions are provided by using an example in which the electronic device 100 is a mobile phone. For ease of description, as shown in FIG. 1, a width direction of the electronic device 100 is defined as an X axis. A length direction of the electronic device 100 is a Y axis. A thickness direction of the electronic device 100 is a Z axis.

Figure 2:
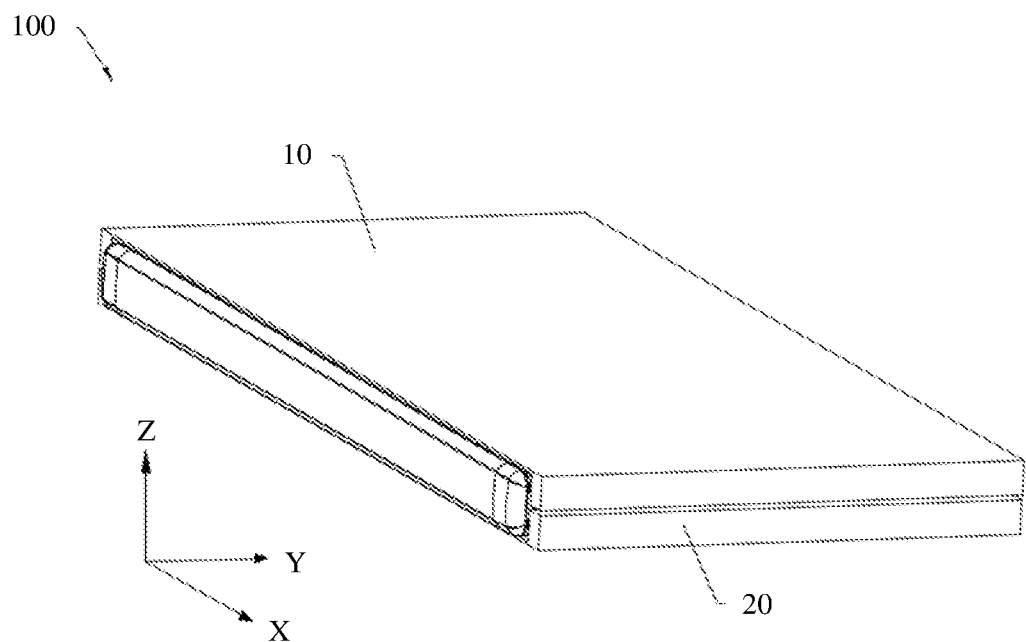
FIG. 2 is a schematic diagram of a structure of the electronic device shown in FIG. 1 in a folded state.

With reference to FIG. 1, FIG. 2 is a schematic diagram of a structure of the electronic device shown in FIG. 1 in a folded state.

The electronic device 100 includes a first housing 10, a second housing 20, and a display module 30. The first housing 10 and the second housing 20 can be unfolded relative to each other to be in an unfolded state. The first housing 10 and the second housing 20 can alternatively be folded relative to each other to be in a folded state. In other words, the first housing 10 and the second housing 20 can be switched between the folded state and the unfolded state. FIG. 1 shows that the electronic device 100 is in the unfolded state. FIG. 2 shows that the electronic device 100 is in the folded state.

In addition, the display module 30 may be configured to display an image, a video, and the like. The display module 30 includes a first part 34, a second part 35, and a third part 36. The second part 35 is connected between the first part 34 and the third part 36. The first part 34, the second part 35, and the third part 36 are located on a same side of the first housing 10 and the second housing 20. In addition, the first part 34 is fastened to the first housing 10. The second part 35 is located between the first housing 10 and the second housing 20. The third part 36 is fastened to the second housing 20.

It may be understood that, when the electronic device 100 is in the unfolded state, the first part 34, the second part 35, and the third part 36 are approximately at 180° (where a slight deviation is allowed, for example, 165°, 177°, or 185°). In this case, the display module 30 has a continuous large-area display region. In other words, the display module 30 can implement large-screen display. Therefore, user experience is better. When the electronic device 100 is in the folded state, the display module 30 is mutually folded. Specifically, the second part 35 is bent. The first part 34 and the third part 36 overlap with each other in the Z direction. In this case, an unfolded area of the display module 30 is small, and this helps reduce a probability of damage to the display module 30.

In addition, FIG. 2 shows that, when the electronic device 100 is in the folded state, the display module 30 is located between the first housing 10 and the second housing 20. In other words, the display module 30 may be folded inward. In another implementation, when the electronic device 100 is in the folded state, the first housing 10 and the second housing 20 may alternatively be located between the first part 34 and the third part 36. In other words, the display module 30 may be folded outward. Specifically, this is not limited in this embodiment.

In addition, FIG. 1 and FIG. 2 both show that the electronic device 100 may be folded once. In another implementation, the electronic device 100 may alternatively be folded for a plurality of times. In other words, the display module 30 may include a plurality of parts. Folding may occur between every two parts.

Figure 3:
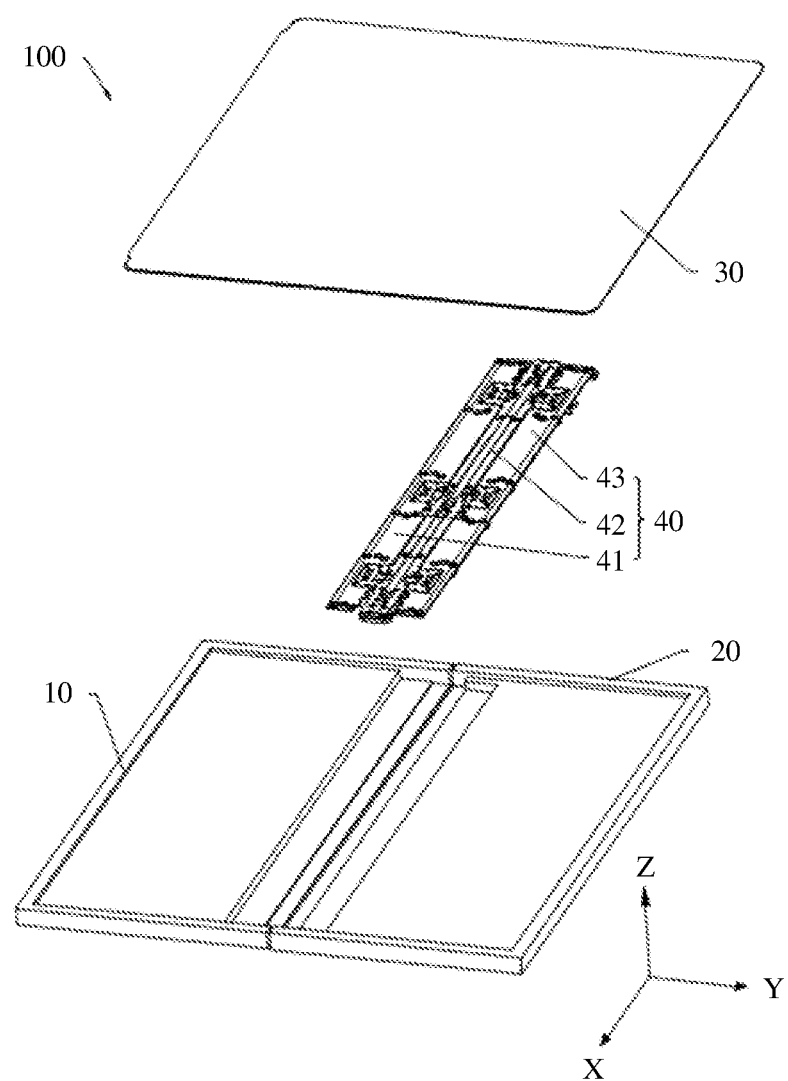
FIG. 3 is a partial schematic exploded view of the electronic device shown in FIG. 1.
Figure 4:
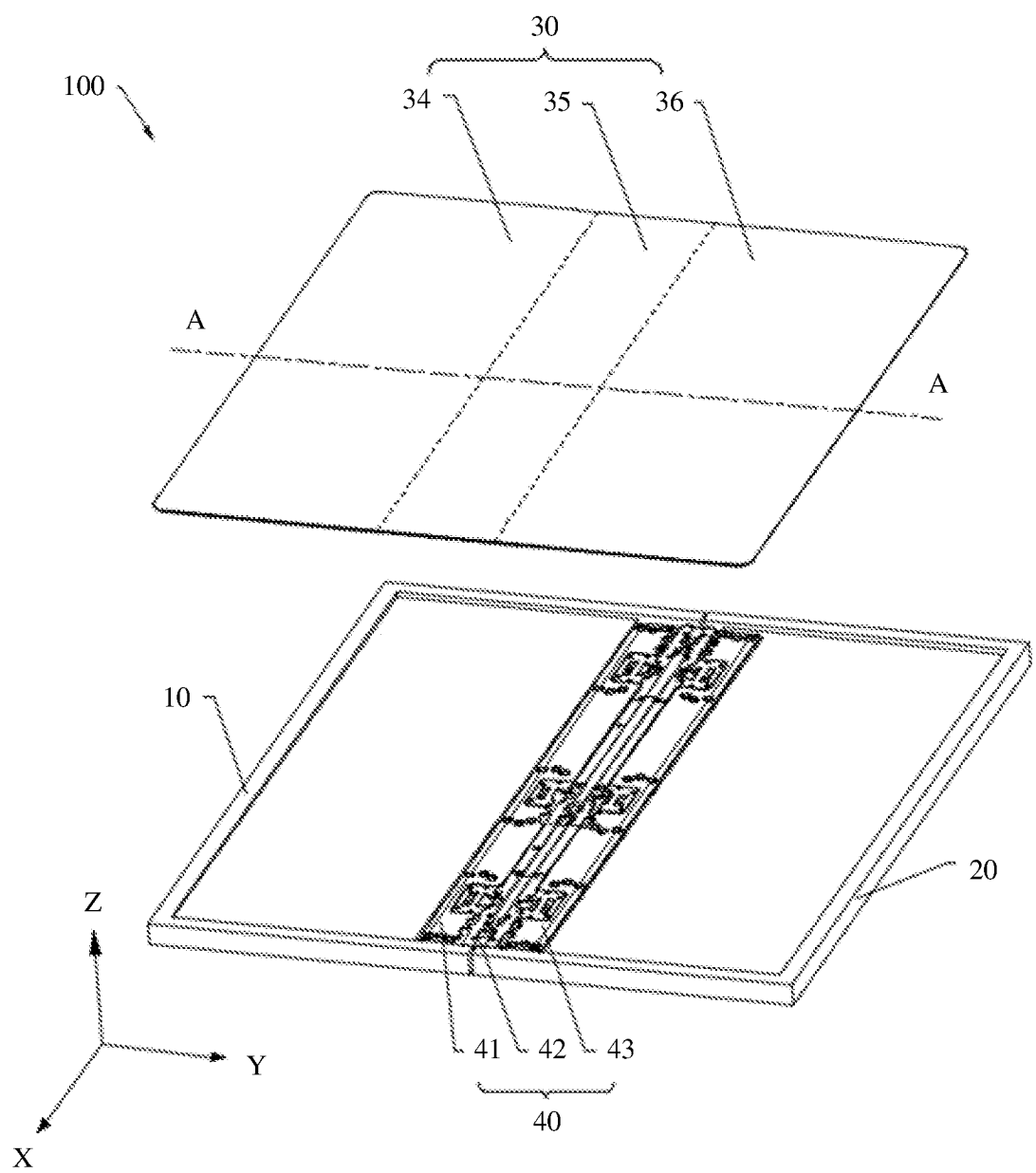
FIG. 4 is a schematic diagram in which a rotation apparatus of the electronic device shown in FIG. 3 is mounted on a first housing and a second housing.

It may be understood that there are a plurality of connection relationships between the first housing 10 and the second housing 20, for example, a rotatable connection, a sliding connection, and a detachable snap-fit connection. In this embodiment, an example in which the first housing 10 is rotatably connected to the second housing 20 is used for description. Refer to FIG. 3 and FIG. 4. FIG. 3 is a partial schematic exploded view of the electronic device 100 shown in FIG. 1. FIG. 4 is a schematic diagram in which a rotation apparatus of the electronic device shown in FIG. 3 is mounted on a first housing and a second housing. The electronic device 100 further includes a rotation apparatus 40. The rotation apparatus 40 is connected to the first housing 10 and the second housing 20. The rotation apparatus 40 enables the first housing 10 and the second housing 20 to rotate relative to each other for folding or unfolding. The rotation apparatus 40 is located between the first housing 10 and the second housing 20, and the rotation apparatus 40 is disposed opposite to the second part 35 of the display module 30.

The rotation apparatus 40 may include a first support plate 41, a second support plate 42, and a third support plate 43. The second support plate 42 is located between the first support plate 41 and the third support plate 43. In addition, the first support plate 41, the second support plate 42, and the third support plate 43 are disposed facing the second part 35 of the display module 30.

In addition, one side of the second support plate 42 is movably connected to the first support plate 41. The other side of the second support plate 42 is alternatively connected to the third support plate 43 movably. In other words, the first support plate 41, the second support plate 42, and the third support plate 43 are movable with each other. In addition, a side that is of the first support plate 41 and that is away from the second support plate 42 is movably connected to the first housing 10. A side that is of the third support plate 43 and that is away from the second support plate 42 is movably connected to the second housing 20. In this case, the first support plate 41, the second support plate 42, and the third support plate 43 cooperate with each other, and the first housing 10 and the second housing 20 can rotate relative to each other for folding or unfolding.

It may be understood that, when the electronic device 100 is unfolded to the unfolded state, the first support plate 41, the second support plate 42, and the third support plate 43 jointly support the second part 35 of the display module 30.

Figure 5:
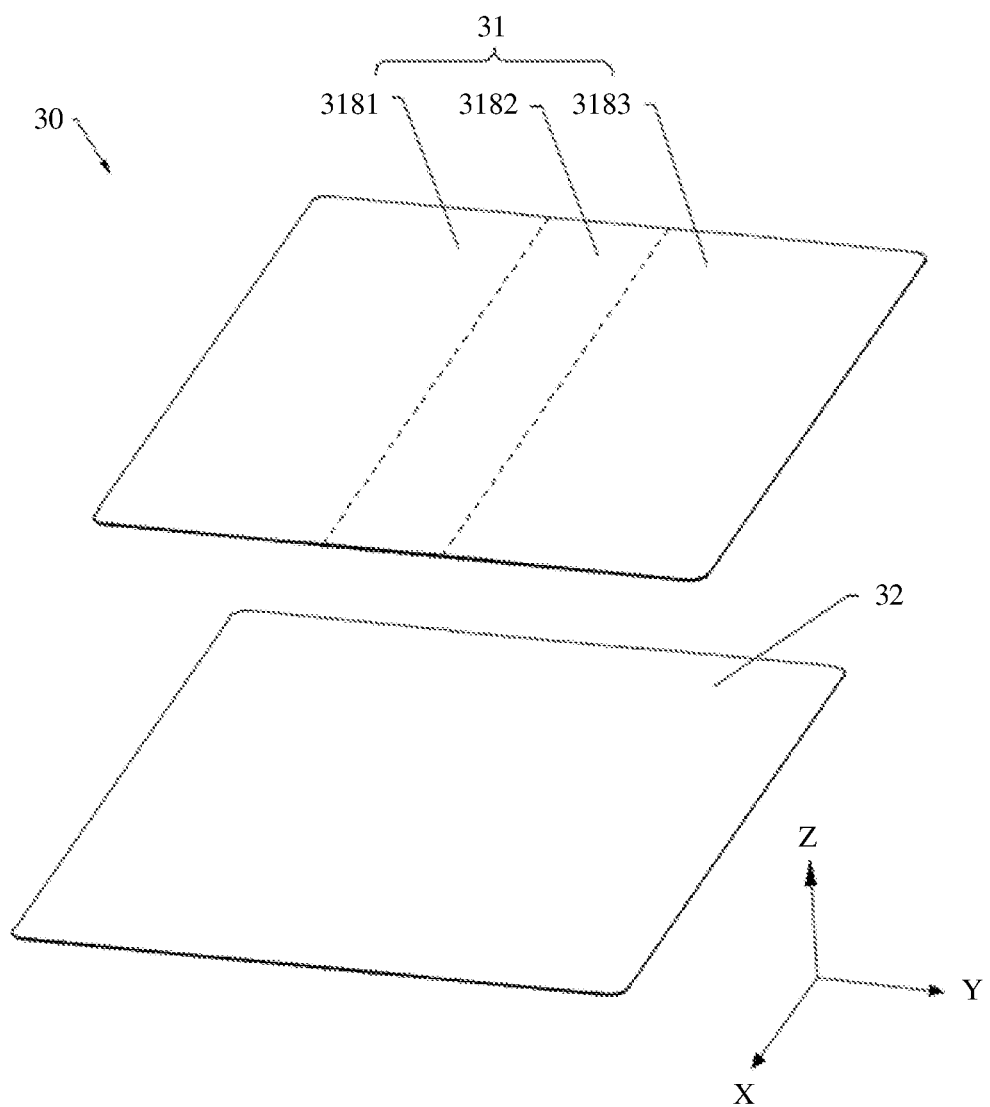
FIG. 5 is a schematic exploded view of a display module of the electronic device shown in FIG. 4.

FIG. 5 is a schematic exploded view of a display module of the electronic device shown in FIG. 4. The display module 30 includes a display 31 and a support 32. The display 31 is configured to display an image, a video, and the like. The display 31 is a flexible display. For example, the display 31 may be an organic light-emitting diode (organic light-emitting diode, OLED) display, an active-matrix organic light-emitting diode (active-matrix organic light-emitting diode, AMOLED) display, a mini light-emitting diode (mini organic light-emitting diode) display, a micro light-emitting diode (micro organic light-emitting diode) display, a micro organic light-emitting diode (micro organic light-emitting diode) display, or a quantum dot light-emitting diode (quantum dot light-emitting diode, QLED) display.

Refer to FIG. 5. With reference to FIG. 4, the display 31 includes a first non-bending region 3181, a bending region 3182, and a second non-bending region 3183 that are successively connected. In other words, the bending region 3182 is connected between the first non-bending region 3181 and the second non-bending region 3183. The first non-bending region 3181 is a portion of the first part 34 of the display module 30. The bending region 3182 is a portion of the second part 35. The second non-bending region 3183 is a portion of the third part 36.

Figure 6:
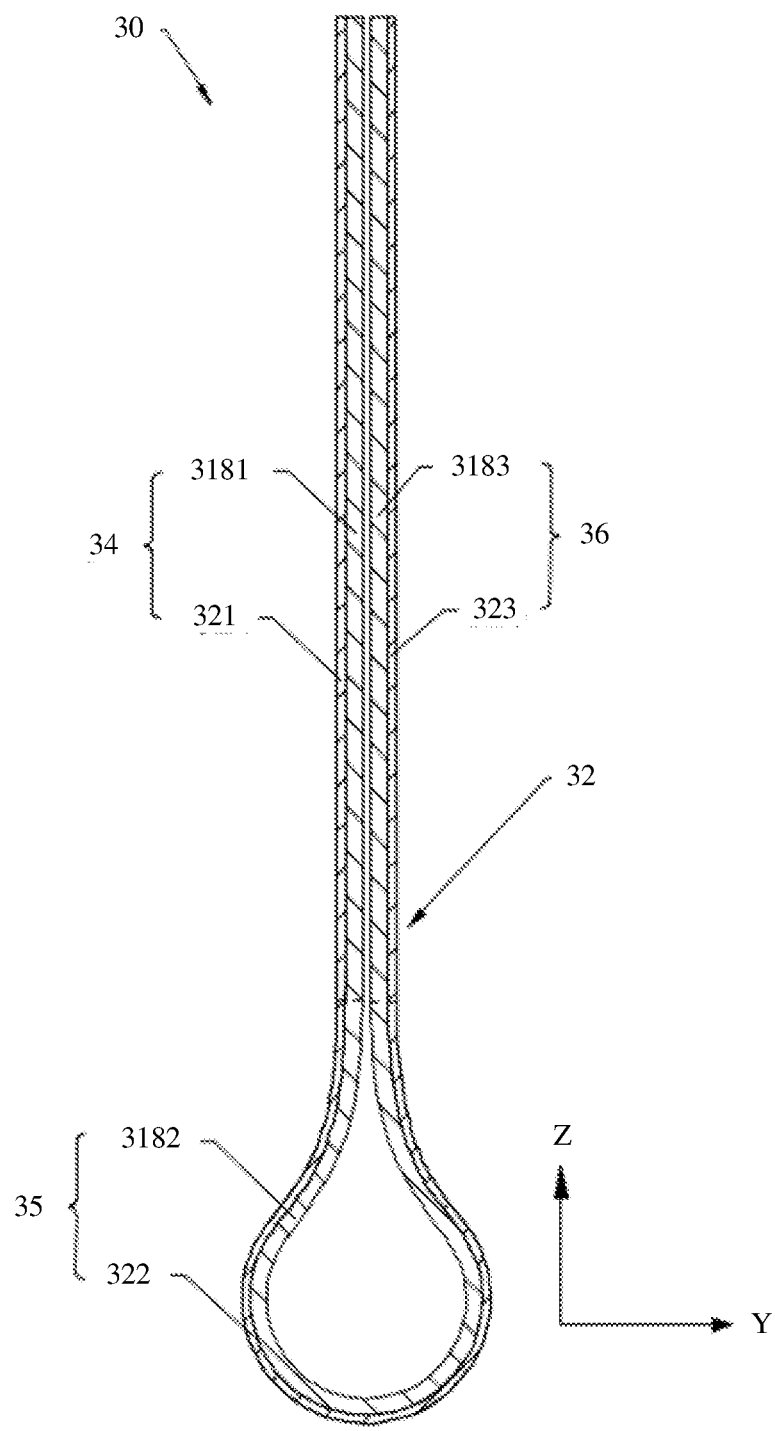
FIG. 6 is a schematic diagram of a display module of the electronic device shown in FIG. 4 in a folded state.

Refer to FIG. 5 and FIG. 6, FIG. 6 is a schematic diagram of a display module of the electronic device shown in FIG. 4 in a folded state. When the electronic device 100 is in the unfolded state, the first non-bending region 3181, the bending region 3182, and the second non-bending region 3183 are approximately at 180° (where a slight deviation is allowed, for example, 165°, 177°, or 185°). When the electronic device 100 is in the folded state, the bending region 3182 is bent, and the first non-bending region 3181 faces the second non-bending region 3183. FIG. 6 shows that the bending region 3182 is approximately water drop-shaped. In another implementation, the bending region 3182 may alternatively be semi-annular. This is not specifically limited in this application.

Figure 7:
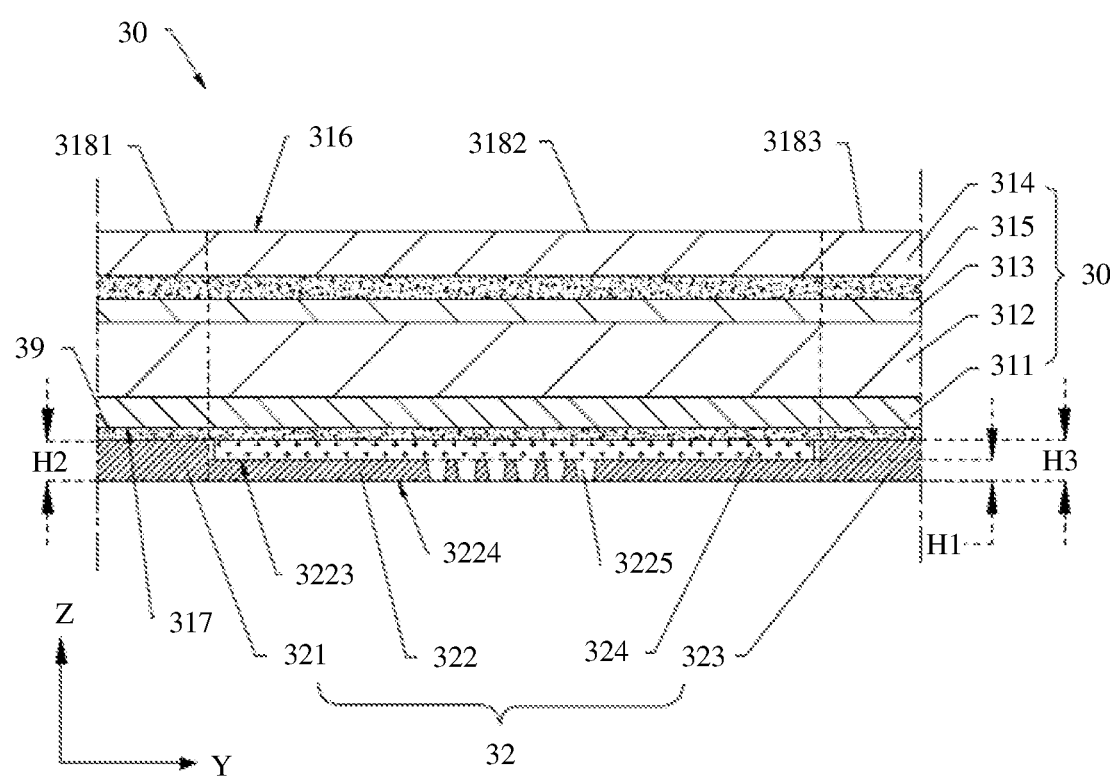
FIG. 7 is an A-A partial schematic sectional view of an implementation of a display module of the electronic device shown in FIG. 4.

FIG. 7 is an A-A partial schematic sectional view of an implementation of a display module of the electronic device shown in FIG. 4. The display 31 may include a back film 311, a display panel 312, a polarizer 313 (polarizer, POL), and a protection cover 314 that are successively stacked. In other words, the display panel 312 is located between the back film 311 and the polarizer 313. The protection cover 314 is fastened to a surface that is away from the display panel 312 and that is of the polarizer 313. The back film 311 may be configured to support the display panel 312. The display panel 312 is configured to display an image, a video, and the like. The protection cover 314 is configured to protect the polarizer 313, the display panel 312, and the like.

In addition, the display 31 further includes an optical clear adhesive 315. The optical clear adhesive 315 is fastened between the polarizer 313 and the protection cover 314. The optical clear adhesive 315 not only enables display light emitted by the display panel 312 to propagate outside the electronic device 100, but also improves flexibility of the display module 30.

In an implementation, the display 31 may be a touch-screen. The display 31 can be configured to generate a touch signal based on a touch action of a user. Specifically, when the user taps an icon of camera software on the display 31, the display 31 can generate a touch signal based on the tapping action of the user, and transmit the touch signal to a processor (not shown in the figure) of the electronic device 100. The processor receives the touch signal, and starts the camera software based on the touch signal. The processor may be mounted on the first housing 10 (refer to FIG. 4), or may be mounted on the second housing 20 (refer to FIG. 4).

The display panel 312 may have a touch function. In other words, the display panel 312 has a function of a touch panel. For example, the touch panel is embedded into a light emitting layer of the display panel 312 by using an on-cell technology. In another implementation, the display panel 312 may alternatively not have a touch function. In this case, the display 31 further includes a touch panel (not shown in the figure). The touch panel may be fastened between the protection cover 314 and the polarizer 313, or may be located between the polarizer 313 and the display panel 312.

Refer to FIG. 7 again. The display 31 includes an outer surface 316 and an inner surface 317 that are disposed opposite to each other. The outer surface 316 of the display 31 refers to a surface, facing the user, of the display 31 when the user normally uses the electronic device 100, namely, a display side of the display 31. The inner surface 317 of the display 31 refers to a surface, facing the interior of the electronic device 100, of the display 31 when the display module 30 is mounted on the first housing 10 and the second housing 20, namely, a non-display side of the display 31. The support 32 of the display module 30 is fastened to the inner surface 317 of the display 31. In an implementation, the support 32 may be fastened to the inner surface 317 of the display 31 by using an optical clear adhesive (OCA), a PVB adhesive, a foam adhesive, a combination thereof, or the like. FIG. 7 shows that an optical clear adhesive 39 is disposed between the support 32 and the inner surface 317 of the display 31.

In this application, a structure of the support 32 has a plurality of disposition manners. The following specifically describes four disposition manners of the support 32 with reference to related accompanying drawings. It may be understood that, in each embodiment, the structure of the support 32 has better flexibility, strength, and hardness. In addition, the support 32 also has better integrity and surface flatness.

In a first embodiment, refer to FIG. 7 again, the support 32 includes a first buffer 324, and a first metal plate 321, a third metal plate 322, and a second metal plate 323 that are successively connected. In other words, the third metal plate 322 is connected between the first metal plate 321 and the second metal plate 323. In FIG. 7, the first metal plate 321, the third metal plate 322, and the second metal plate 323 are distinguished by using dashed lines. In addition, the first buffer 324 is located between the first metal plate 321 and the second metal plate 323, and the first buffer 324 and the third metal plate 322 are disposed in a stacked manner. In this implementation, the first buffer 324 is fastened to a surface that is of the third metal plate 322 and that faces the display 31. It may be understood that a direction in which the first metal plate 321 faces the second metal plate 323 is a length direction of the electronic device 100, namely, a positive direction of the Y-axis. A direction perpendicular to the direction in which the first metal plate 321 faces the second metal plate 323 is a width direction of the electronic device 100, namely, the X-axis direction.

In addition, in the Z direction, a height of the third metal plate 322 is H1. A height of the first metal plate 321 is H2. A height of the second metal plate 323 is H3. H1 is less than H2. H1 is less than H3. In another implementation, H1 may alternatively be equal to H2. Alternatively, H1 may alternatively be equal to H3.+

In addition, with reference to FIG. 6, the first metal plate 321 is disposed facing the first non-bending region 3181. The first metal plate 321 is a portion of the first part 34 of the display module 30. Specifically, the first metal plate 321 is fastened to the first non-bending region 3181 by using the optical clear adhesive 39.

Both the third metal plate 322 and the first buffer 324 are disposed facing the bending region 3182. Both the third metal plate 322 and the first buffer 324 are a portion of the second part 35. Specifically, the third metal plate 322 and the first buffer 324 are fastened to the bending region 3182 by using the optical clear adhesive 39. Both the third metal plate 322 and the first buffer 324 can be bent.

The second metal plate 323 is disposed facing the second non-bending region 3183. The second metal plate 323 is a portion of the third part 36. Specifically, the second metal plate 323 is fastened to the second non-bending region 3183 by using the optical clear adhesive 39.

Refer to FIG. 6 and FIG. 7 again, when the electronic device 100 is in the folded state, the third metal plate 322 and the first buffer 324 are bent, and the first metal plate 321 and the second metal plate 323 are disposed opposite to each other. FIG. 6 shows that the support 32 is approximately water drop-shaped. In another implementation, the support 32 may alternatively be annular. This is not specifically limited in this application. When the electronic device 100 is in the unfolded state, the first metal plate 321, the third metal plate 322, the second metal plate 323, and the first buffer 324 are approximately at 180° (where a slight deviation is allowed, for example, 165°, 177°, or 185°).

A material of the first metal plate 321 may alternatively be, but is not limited to, copper, aluminum, beryllium copper, stainless steel, a titanium alloy, or the like. A material of the second metal plate 323 may alternatively be, but is not limited to, copper, aluminum, beryllium copper, stainless steel, a titanium alloy, or the like. A material of the third metal plate 322 may alternatively be, but is not limited to, copper, aluminum, beryllium copper, stainless steel, a titanium alloy, or the like. In addition, a material of the first buffer 324 may alternatively be, but is not limited to, a polymer material. The material of the first buffer 324 may alternatively be another elastic material.

Refer to FIG. 7 again, the third metal plate 322 includes a first surface 3223 and a second surface 3224 that are disposed opposite to each other. The first surface 3223 faces the display 31. The third metal plate 322 is provided with a plurality of through holes 3225. Each through hole 3225 penetrates from the first surface 3223 to the second surface 3224. The first buffer 324 is fastened to the first surface 3223, and the first buffer 324 covers each through hole 3225. The plurality of through holes 3225 are hollowed out. It may be understood that, hollow-out means that the through hole 3225 is not filled with another material, that is, the through hole 3225 is filled with air. Certainly, because the first buffer 324 is fastened to the first surface 3223, and the first buffer 324 is elastic, when the electronic device 100 is unfolded or folded, a small portion of the first buffer 324 may be allowed to be squeezed into the through hole 3225. A quantity of through holes 3225 is not limited to only six shown in FIG. 7.

It may be understood that, because the material of the third metal plate 322 is metal, the third metal plate 322 has better hardness and stiffness. In this case, when the electronic device 100 is in the unfolded state, the third metal plate 322 has sufficient stiffness and hardness to support the bending region 3182 of the display 31, to prevent the bending region 3182 of the display 31 from collapsing, that is, to ensure that the display 31 has better surface flatness.

In addition, the height H1 of the third metal plate 322 is set to be less than the height H2 of the first metal plate 321 and the height H3 of the second metal plate 323. In addition, the plurality of through holes 3225 are disposed on the third metal plate 322, so that the third metal plate 322 has better flexibility. In this case, in the process of unfolding or folding the electronic device 100, the third metal plate 322 can absorb stress in the bending process, so that impact of the third metal plate 322 on the display 31 in the bending process is reduced.

In addition, the first support plate 41, the second support plate 42, and the third support plate 43 of the rotation apparatus 40 are generally provided with a plurality of through holes or grooves. The through hole or the groove may be used as a shelter or configured to lock a fastener. In this case, when the electronic device 100 is in the unfolded state, peripheral edges of the grooves or the through holes on the first support plate 41, the second support plate 42, and the third support plate 43 of the rotation apparatus 40 are prone to squeeze the third metal plate 322. Because stress on the peripheral edges of the through holes 3225 of the third metal plate 322 is concentrated, the peripheral edges of the through holes 3225 can squeeze the optical clear adhesive 39 with a large squeezing force. In this case, the optical clear adhesive 39 protrudes, so that a problem such as a black spot or a bright line is prone to occur on the display 31. However, in this implementation, the first buffer 324 is fastened between the third metal plate 322 and the display 31, so that when the peripheral edges of the grooves or the through holes on the first support plate 41, the second support plate 42, and the third support plate 43 squeeze the third metal plate 322, the third metal plate 322 can transfer squeezing force to the first buffer 324. In this case, the first buffer 324 has sufficient flexibility to absorb a portion of the squeezing force, so as to reduce force with which the peripheral edges of the through holes 3225 of the third metal plate 322 squeeze the display 31. Therefore, the problem such as the black spot or the bright line due to excessive squeezing is prevented, to a large degree, from occurring on the display 31.

In addition, when the peripheral edges of the grooves or the through holes on the first support plate 41, the second support plate 42, and the third support plate 43 squeeze the third metal plate 322, if the third metal plate 322 breaks, the peripheral edges squeeze towards the display 31. In this case, the first buffer 324 can also prevent the broken third metal plate 322 from directly piercing or squeezing towards the display 31. Therefore, the problem such as the black spot or the bright line is prevented, to a large degree, from occurring on the display 31.

In addition, in this embodiment, hardness and stiffness of the first metal plate 321 and the second metal plate 323 are high. In this case, in the process of unfolding or folding the electronic device 100, the first metal plate 321 has better hardness and stiffness to support the first non-bending region 3181 of the display 31, and the second metal plate 323 has better hardness and stiffness to support the second non-bending region 3183 of the display 31. Therefore, the display 31 is prevented from collapsing, that is, it is ensured that the display module 30 has better surface flatness.

In addition, the first metal plate 321, the third metal plate 322, the second metal plate 323, and the first buffer 324 can form an integral component (a support plate 32). In this case, a manner in which the support 32 as the integral component is mounted on the display 31 is simple, namely, an assembly manner of the display module 30 can be simplified.

In an implementation, the first metal plate 321, the third metal plate 322, and the second metal plate 323 are an integrally formed structure. In this case, connection firmness between the first metal plate 321, the third metal plate 322, and the second metal plate 323 is better. In addition, there are few steps for forming the first metal plate 321, the third metal plate 322, and the second metal plate 323. This can reduce input costs of the support 32.

Specifically, the first metal plate 321, the third metal plate 322, and the second metal plate 323 that are successively connected are formed on an integral plate by using a CNC machining process. In this case, the through hole 3225 is etched on the third metal plate 322. In addition, in another implementation, the first metal plate 321, the third metal plate 322, and the second metal plate 323 that are successively connected may alternatively be formed by using an injection molding process, in a chemical corrosion manner, or another manner.

In another implementation, the first metal plate 321, the third metal plate 322, and the second metal plate 323 may alternatively be formed through welding or connected in a snap-fit fastening manner.

In an implementation, the first metal plate 321, the second metal plate 323, and the third metal plate 322 are the same in material. In this case, the support 32 has fewer material types. This can reduce material preparation steps of the support 32, and reduce input costs of the support 32.

In an implementation, the first metal plate 321, the third metal plate 322, and the second metal plate 323 are formed in one step. It may be understood that the one-step forming includes manners such as extrusion molding, injection molding, compression molding, and calendering. In this way, steps of a machining technology of the support 32 are few, and input costs of the support 32 can be reduced.

Refer to FIG. 7 again. In the Z direction, namely, in a thickness direction of the display module 30, the height H1 of the third metal plate 322 ranges from 0.015 millimeter to 0.3 millimeter. In this way, the hardness and the stiffness of the third metal plate 322 are ensured, and the flexibility of the third metal plate 322 is better. In other words, the hardness and the stiffness of the third metal plate 322 are moderate.

Refer to FIG. 7 again. In the Z direction, the height H2 of the first metal plate 321 and the height H3 of the second metal plate 323 range from 0.1 millimeter to 0.5 millimeter. In this way, the first metal plate 321 and the second metal plate 323 have sufficient hardness and stiffness, so that in the process of unfolding or folding the electronic device 100, the first metal plate 321 and the second metal plate 323 can effectively support the display 31. In addition, the first metal plate 321 and the second metal plate 323 are thin, so that the first metal plate 321 and the second metal plate 323 do not increase the thickness of the display module 30 to a large degree either.

Figure 8:
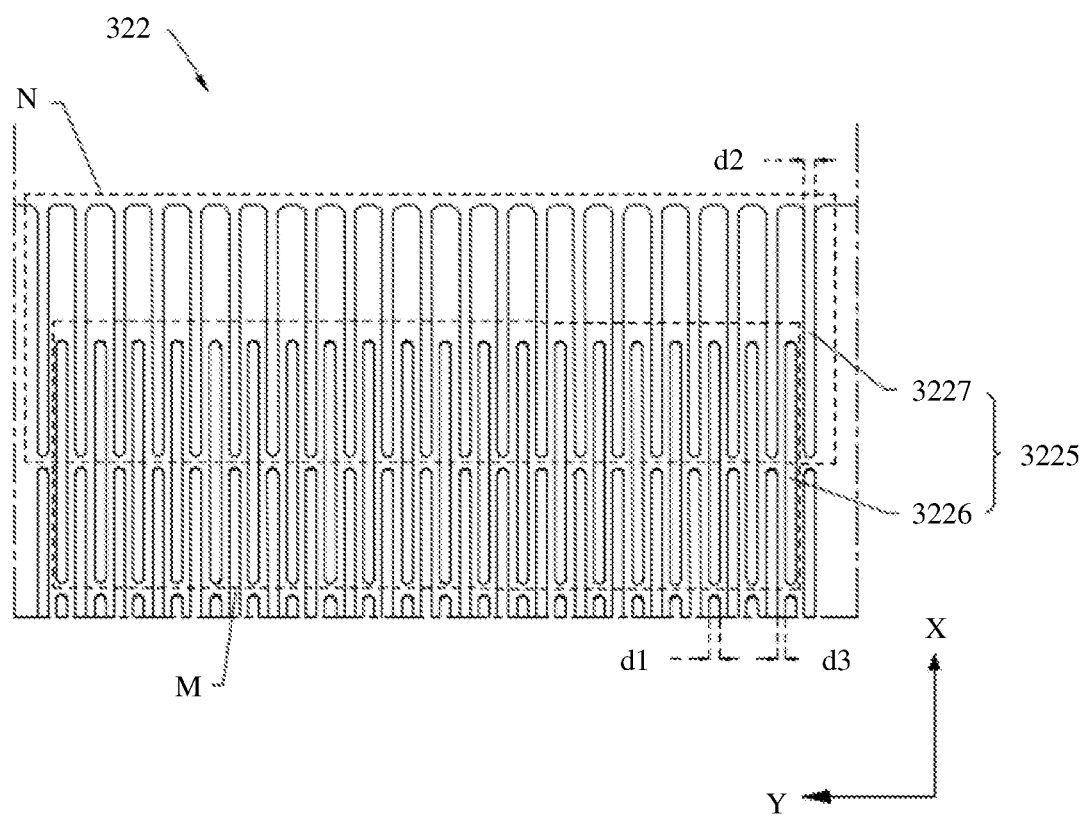
FIG. 8 is a schematic diagram of a partial structure of a third metal plate of the display module shown in FIG. 7.

FIG. 8 is a schematic diagram of a partial structure of a third metal plate of the display module shown in FIG. 7. The third metal plate 322 is provided with a plurality of first through hole groups M and two second through hole groups N. The two second through hole groups N are respectively located on two sides of the plurality of first through hole groups M. FIG. 8 shows a second through hole group N in a positive direction of the X-axis. It may be understood that one second through hole group N is also correspondingly disposed in a negative direction of the X-axis. Certainly, in another implementation, the third metal plate 322 may alternatively be not provided with two second through hole groups N.

The plurality of first through hole groups M are arranged in the X-axis direction. It may be understood that, in the X-axis direction, every two first through hole groups M may be disposed in parallel with each other, but a slight deviation is allowed, for example, 155°, 166°, or 177°. In addition, each first through hole group M includes a plurality of first through holes 3226. The plurality of first through holes 3226 are arranged at intervals in the Y-axis direction. It may be understood that, in the Y-axis direction, connection lines of every two first through holes 3226 may be disposed in parallel with each other, but a slight deviation is allowed, for example, 155°, 166°, or 177°. In addition, FIG. 8 shows that a plurality of first through holes 3226 in two adjacent first through holes groups M are arranged to cover partly with each other. In other words, the first through holes 3226 in the two adjacent first through hole groups M overlap with each other. In another implementation, the plurality of first through holes 3226 in the first through hole groups M may alternatively be spaced from each other.

Each second through hole group N includes a plurality of second through holes 3227. A plurality of second through holes 3227 in a same second through hole group N are arranged at intervals in the Y-axis direction. It may be understood that, in the Y-axis direction, every two second through holes 3227 may be disposed in parallel with each other, but a slight deviation is allowed, for example, 155°, 166°, or 177°. In addition, the plurality of second through holes 3227 in the same second through hole group N penetrate through a side surface of the third metal plate 322. FIG. 8 shows that the plurality of second through holes 3227 in the second through hole group N in the positive direction of the X axis all penetrate through the side surface of the third metal plate 322.

In addition, FIG. 8 shows that at least a portion of each second through hole 3227 is located between two first through holes 3226. In other words, the second through hole 3227 overlaps with the first through holes 3226. In another implementation, each second through hole 3227 may alternatively be spaced from the first through hole 3226.

In this implementation, the first through hole groups M and the two second through hole groups N are disposed on the third metal plate 322, so that overall flexibility of the third metal plate 322 can be improved to ensure that the display module 30 has better flexibility.

In addition, the plurality of second through holes 3227 penetrate through a side surface of the third metal plate 322, to avoid partial concentrated stress at a side portion of the third metal plate 322. In this case, in the process of unfolding or folding the electronic device 100, the second through hole 3227 can absorb stress of the display module 30 in the bending process. In other words, this avoids that the display module 30 is not easily bent due to excessive stress on the side surface of the third metal plate 322.

Refer to FIG. 8 again, the first through hole 3226 is a strip-shaped hole. An extension direction of the first through hole 3226 is parallel to the X-axis direction. A width d1 of the first through hole 3226 in the Y-axis direction ranges from 0.15 millimeter to 3 millimeters. For example, d1 is equal to 0.15 millimeter, 0.26 millimeter, 1 millimeter, 2 millimeters, or 3 millimeters. In another implementation, the extension direction of the first through hole 3226 may alternatively be parallel to the Y-axis direction.

In this implementation, when the extension direction of the first through hole 3226 is parallel to the X-axis direction, and the width d1 of the first through hole 3226 in the Y-axis direction ranges from 0.15 millimeter to 3 millimeters, an area that is of a hollow-out region formed by the third metal plate 322 and that is on an X-Y plane is large. In this case, in the process of unfolding or folding the electronic device 100, the first through hole 3226 can absorb stress of the display module 30 in the bending process. In other words, this avoids that the display 31 is not easily bent due to excessive stress of the third metal plate 322. Therefore, a bending effect of the display module 30 is improved.

In an implementation, the second through hole 3227 is a strip-shaped hole. An extension direction of the second through hole 3227 is parallel to the X direction. A width d2 of the second through hole 3227 in the Y-axis direction ranges from 0.15 millimeter to 3 millimeters. For example, d2 is equal to 0.15 millimeter, 0.26 millimeter, 1 millimeter, 2 millimeters, or 3 millimeters. In another implementation, the extension direction of second first through hole 3227 may alternatively be parallel to the Y-axis direction.

In this implementation, when the extension direction of the second through hole 3227 is parallel to the X-axis direction, and the width d2 of the second through hole 3227 in the Y-axis direction ranges from 0.15 millimeter to 3 millimeters, an area that is of a hollow-out region formed by the third metal plate 322 and that is on an X-Y plane is large. In this case, in the process of unfolding or folding the electronic device 100, the second through hole 3227 can absorb stress of the display module 30 in the bending process. In other words, this avoids that the display 31 is not easily bent due to excessive stress of the third metal plate 322. Therefore, a bending effect of the display module 30 is improved.

In an implementation, in the Y-axis direction, a distance d3 between two adjacent first through holes 3226 in a same first through hole group M is less than or equal to 0.5 millimeter. For example, d3 is equal to 0.05 millimeter, 0.1 millimeter, 0.2 millimeter, 0.5 millimeter, 0.6 millimeter, or 0.8 millimeter. In this case, the third metal plate 322 not only has better hardness and stiffness, but also has better flexibility.

In this embodiment, the first buffer 324 may have a plurality of disposition manners. The following specifically describes three main deposition manners of the first buffer 324.

In a first implementation, refer to FIG. 7 again. The first buffer 324 is a single-sided adhesive tape, that is, a single-sided tape. The adhesive tape may be, but is not limited to, a foam adhesive tape. The first buffer 324 is bonded to a surface that is of the third metal plate 322 and that faces the display 31.

Specifically, when the first metal plate 321, the third metal plate 322, and the second metal plate 323 that have an integrally formed structure are processed, and the third metal plate 322 is provided with the through holes 3225, the first buffer 324 is bonded to the surface that is of the third metal plate 322 and that faces the display 31. In this case, the first metal plate 321, the third metal plate 322, the second metal plate 323, and the first buffer 324 are integrated as a whole. In addition, a non-adhesive side of the first buffer 324 is fastened to the display 31 by using the optical clear adhesive 39.

It may be understood that because the adhesive tape has better flexibility, in the process of unfolding or folding the electronic device 100, the adhesive tape can absorb stress, so that the display 31 has better bending performance. In addition, because the adhesive tape may be bonded, a manner in which the adhesive tape is fastened to the third metal plate 322 is simple and easy to operate. In addition, compared with a solution in which the first buffer 324 is fastened to the third metal plate 322 through a fastener adhesive, the fastener adhesive is omitted in this implementation. Therefore, input costs of the support 32 can be reduced.

In another implementation, the first buffer 324 may alternatively be a double-sided adhesive tape, that is, a double-sided tape. In this case, one side of the first buffer 324 is bonded to the surface that is of the third metal plate 322 and that faces the display 31, and the other side may alternatively be bonded to the optical clear adhesive 39 and fastened to the display 31 by using the optical clear adhesive 39.

In addition, FIG. 7 shows that the through hole 3225 is a trapezoidal hole, and a size of a side that is of the through hole 3225 and that is close to the first buffer 324 is large. In another implementation, the through hole 3225 is a trapezoidal hole, and a size of a side that is of the through hole 3225 and that is close to the first buffer 324 may alternatively be set to be small, or a cross section of the through hole 3225 may alternatively be in a rectangular shape or an irregular shape.

In an implementation, one side of the first buffer 324 is connected to the first metal plate 321, and the other side is connected to the second metal plate 323. In this case, a gap no long exists between the first buffer 324 and the first metal plate 321, and a gap no longer exists between the first buffer 324 and the second metal plate 323. Therefore, a surface that is of the support 32 and that faces the display 31 is flat. In this case, there are few stress concentration regions on the support 32, so that in the process of unfolding or folding the electronic device 100, some regions of the support 32 are prevented from excessively squeezing the display 31 due to stress concentration.

Figure 9:
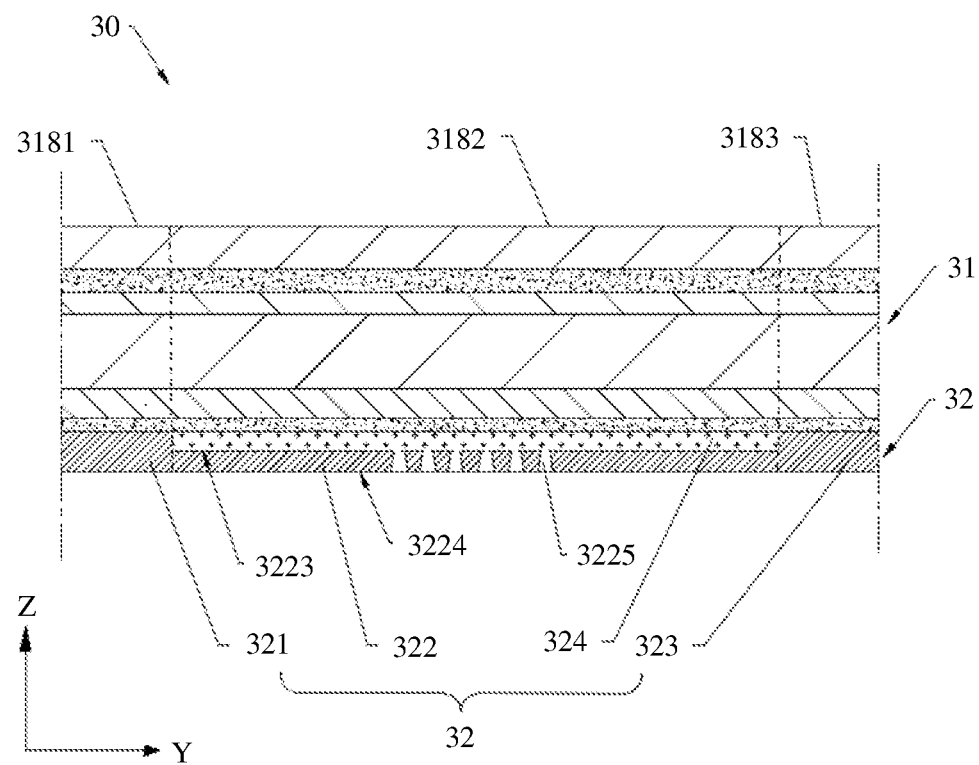
FIG. 9 is an A-A partial schematic sectional view of another implementation of a display module of the electronic device shown in FIG. 4.

In a second implementation, FIG. 9 is an A-A partial schematic sectional view of still another implementation of a display module of the electronic device shown in FIG. 4. The first buffer 324 is connected to the third metal plate 322 through injection molding, that is, the first buffer 324 is formed on the third metal plate 322 by using an injection molding process, and is connected to the third metal plate 322.

Specifically, when the first metal plate 321, the third metal plate 322, and the second metal plate 323 that have an integrally formed structure are processed, and the third metal plate 322 is not provided with a through hole 3225, a polymer material is injection-molded on the surface of the third metal plate 322 by using the injection molding process. After the polymer material is cooled and solidified, the polymer material forms the first buffer 324. In this case, a through hole 3225 is provided on a surface that is of the third metal plate 322 and that is away from the first buffer 324. FIG. 9 shows that the through hole 3225 is a trapezoidal hole, and a size of a side that is of the through hole 3225 and that is close to the first buffer 324 is small. In another implementation, the through hole 3225 may alternatively be a cylindrical hole or a special-shaped hole.

It may be understood that, the first buffer 324 is connected to the third metal plate 322 through injection molding, so that connection firmness between the first buffer 324 and the third metal plate 322 can be improved, and integrity of the first buffer 324 and the third metal plate 322 is better.

In an implementation, a material of the first buffer 324 includes P4U. The material of the first buffer 324 further includes at least one of PU, thermoplastic polyurethane elastomer rubber (thermoplastic polyurethanes, TPU), a thermoplastic elastomer (thermoplastic elastomer, TPE), a thermoplastic rubber material (thermoplastic rubber material, TPR), thermoplastic vulcanizate (thermoplastic polyolefin, TPV), and an ethylene vinyl acetate copolymer (ethylene vinyl acetate copolymer, EVA). In this implementation, the material of the first buffer 324 includes P4U and PU. In another implementation, the material of the first buffer 324 may alternatively include P4U, TPR, and TPV. Specifically, this is not limited in this embodiment.

It may be understood that when the electronic device 100 is normally used (that is, the electronic device 100 is not collided or impacted), the P4U and the PU can maintain soft, that is, an elastic modulus of the third metal plate 322 is small. In this case, in the process of unfolding or folding the electronic device, the third metal plate 322 has small impact on folding or unfolding of the display 31, namely, the P4U and the PU can ensure that the display module 30 has better bending performance.

In addition, when the electronic device 100 is collided or impacted, the P4U and the PU are severely collided or impacted by the third metal plate 322. In this case, molecules in the P4U and the PU can immediately lock each other, and quickly shrink and harden. In this case, the elastic modulus of the third metal plate 322 is significantly increased to prevent the display 31 from being deformed due to squeezing by the third metal plate 322. When impact force or squeezing force exerted on the P4U and the PU disappears, the P4U and the PU can quickly return to soft, that is, the P4U and the PU change from being hard to being soft. Therefore, it is ensured that the display module 30 can continue to be bent or unfolded.

In a third implementation, the first buffer 324 is connected to the third metal plate 322 through ultraviolet curing and thermal curing. Specifically, the first buffer 324 includes an ultraviolet-cured adhesive or a thermal-cured adhesive.

In an implementation, the first buffer 324 includes the ultraviolet-cured adhesive. Specifically, when the first metal plate 321, the third metal plate 322, and the second metal plate 323 that have an integrally formed structure are processed, and the third metal plate 322 is not provided with a through hole 3225, the surface of the third metal plate 322 is filled with an uncured ultraviolet-cured adhesive. The uncured ultraviolet-cured adhesive is irradiated by using ultraviolet light. The uncured ultraviolet-cured adhesive is cured under ultraviolet light to form the first buffer 324. In this case, a through hole 3225 is provided on a surface that is of the third metal plate 322 and that is away from the first buffer 324.

In this implementation, the first buffer 324 is connected to the third metal plate 322 through ultraviolet curing, so that connection firmness between the first buffer 324 and the third metal plate 322 can be improved, and integrity of the first buffer 324 and the third metal plate 322 is better.

In an implementation, the first buffer 324 includes a thermal-cured adhesive.

Specifically, when the first metal plate 321, the third metal plate 322, and the second metal plate 323 that have an integrally formed structure are processed, and the third metal plate 322 is not provided with a through hole 3225, the surface of the third metal plate 322 is filled with an uncured thermal-cured adhesive. The thermal-cured adhesive may be but is not limited to glue. In this case, the glue may be naturally cured at a normal temperature, to form the first buffer 324. In this case, a through hole 3225 is provided on a surface that is of the third metal plate 322 and that is away from the first buffer 324.

Figure 10:
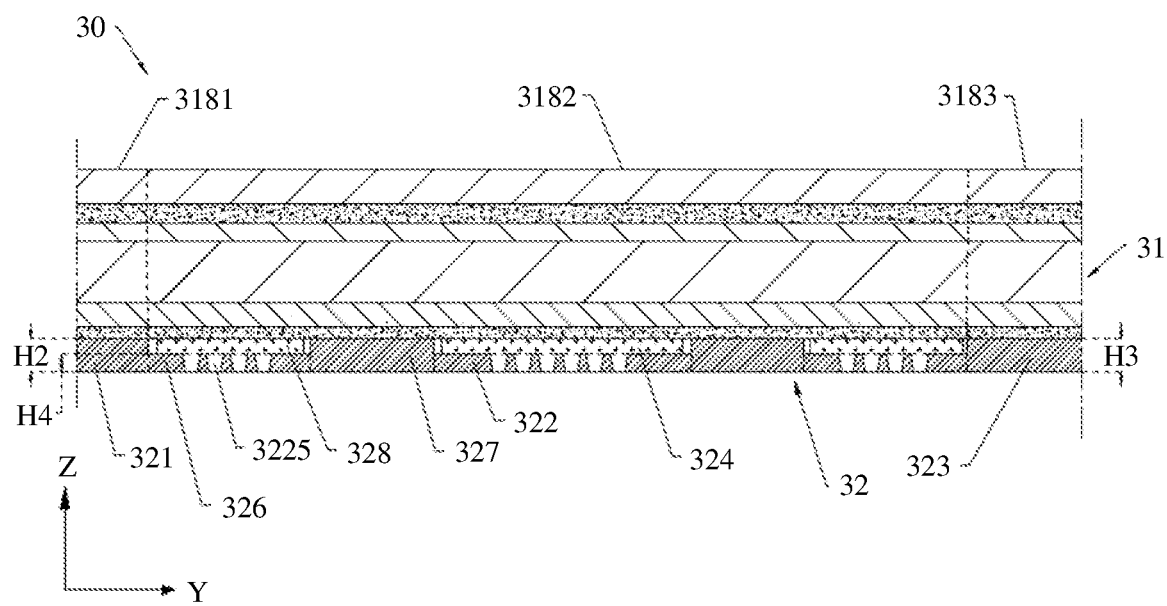
FIG. 10 is an A-A partial schematic sectional view of still another implementation of a display module of the electronic device shown in FIG. 4.

FIG. 10 is an A-A partial schematic sectional view of another implementation of a display module of the electronic device shown in FIG. 4. The support 32 further includes a fourth metal plate 326, a fifth metal plate 327, and a third buffer 328 that face the bending region 3182 of the display 31. The first metal plate 321, the fourth metal plate 326, the fifth metal plate 327, the third metal plate 322, and the second metal plate 323 are successively connected. The fourth metal plate 326 can be bent. The third buffer 328 is located between the first metal plate 321 and the fifth metal plate 327, and the third buffer 328 and the fourth metal plate 326 are disposed in a stacked manner. In an implementation, the third buffer 328 is fastened between the display 31 and the fourth metal plate 326.

In addition, in the Z direction, a height H4 of the fourth metal plate 326 is less than a height H2 of the first metal plate 321 and a height H3 of the second metal plate 323. The fourth metal plate 326 is provided with a plurality of through holes 3225. In another implementation, in the Z direction, the height H4 of the fourth metal plate 326 may alternatively be equal to the height H2 of the first metal plate 321 and the height H3 of the second metal plate 323.

For a disposition manner of the through hole 3225 on the fourth metal plate 326, refer to the foregoing disposition manner of the through hole 3225 on the third metal plate 322. A material of the fourth metal plate 326 may be, but is not limited to, copper, aluminum, beryllium copper, stainless steel, a titanium alloy, or the like. A material of the fifth metal plate 327 may be, but is not limited to, copper, aluminum, beryllium copper, stainless steel, a titanium alloy, or the like. For a material and a disposition manner of the third buffer 328, refer to the material and the disposition manner of the first buffer 324 in the foregoing implementations. Details are not described herein.

In this implementation, because the fourth metal plate 326 is provided with the through holes 3225, overall hardness and stiffness of the fourth metal plate 326 are moderate. In addition, the third buffer 328 is disposed on the fourth metal plate 326 in a stacked manner. In this case, flexibility of some regions of the support 32 can be improved through cooperation between the fourth metal plate 326 and the third buffer 328. In this case, a quantity of regions of the support 32 that have better flexibility may increase. Therefore, when the support 32 is fastened to the display 31, the fourth metal plate 326 may alternatively be fastened to a region with a larger bending angle in the bending region 3182 of the display 31, to ensure that the bending region 3182 of the display 31 has a better bending effect.

In another embodiment, the third buffer 328 may also be fastened to a surface that is of the fourth metal plate 326 and that is away from the display 31.

In another embodiment, the support 32 may further include a fourth buffer (not shown in the figure). The fourth buffer is fastened to the fourth metal plate 3253, and the fourth buffer and the third buffer 328 are disposed opposite to each other. In other words, when the third buffer 328 is fastened between the display 31 and the fourth metal plate 326, the fourth buffer is fastened to a surface that is of the fourth metal plate 326 and that is away from the display 31. When the third buffer 328 is fastened to the surface that is of the fourth metal plate 326 and that is away from the display 31, the fourth buffer is fastened between the display 31 and the fourth metal plate 326.

In another implementation, the support 32 may further include a sixth metal plate, . . . , and an $S^{th}$ metal plate. S is an integer greater than 6. The $S^{th}$ metal plate includes at least one metal plate. The $S^{th}$ metal plate includes at least one metal plate. The metal plate is provided with the plurality of through holes 3225.

In addition, the support 32 may further include a fifth buffer, . . . , and a $P^{th}$ buffer. P is an integer greater than 5. The $P^{th}$ buffer is fastened between the display 31 and the metal plate on which the plurality of through holes 3225 are disposed.

The foregoing specifically describes a first embodiment of the display module 30. The display module 30 includes a first buffer 324. The first buffer 324 is fastened between the third metal plate 322 and the display 31. The following specially describes a second embodiment by using related accompanying drawings: The first buffer 324 is fastened to a surface that is of the third metal plate 322 and that is away from the display 31.

In the second embodiment, same content as that in the first embodiment is not described again. In other words, most content of the first embodiment may be directly applied to the second embodiment.

Figure 11:
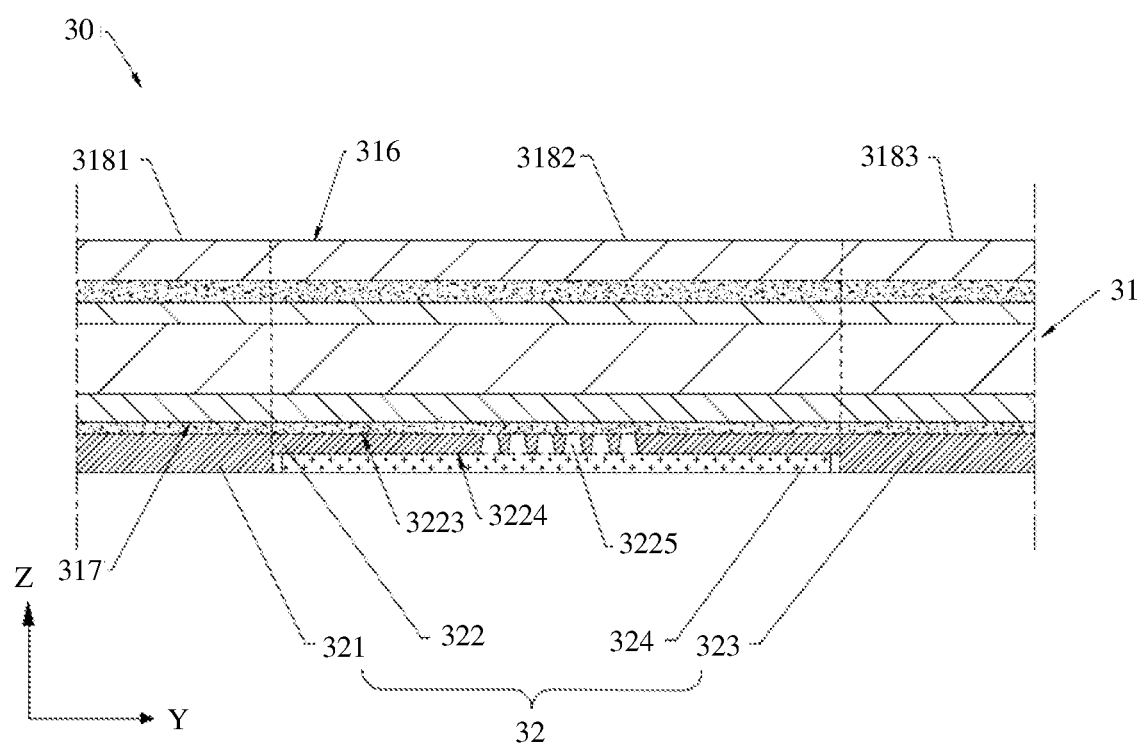
FIG. 11 is an A-A partial schematic sectional view of a further implementation of a display module of the electronic device shown in FIG. 4.

FIG. 11 is an A-A partial schematic sectional view of still another implementation of a display module of the electronic device shown in FIG. 4. The first buffer 324 is fastened to a surface that is of the third metal plate 322 and that is away from the display 31, that is, the first buffer 324 is fastened to the second surface 3224 of the third metal plate 322, and covers the through hole 3225. For a material and a formation manner of the first buffer 324 in this implementation, refer to the material and the formation manner of the first buffer 324 in the first embodiment. Details are not described herein.

It may be understood that, the first buffer 324 is disposed on the second surface 3224 of the third metal plate 322, to further improve flexibility of the support 32 disposed on the bending region 3182 facing the display 31. In this case, in the process of unfolding or folding the electronic device 100, the support 32 disposed facing the bending region 3182 can avoid impact on bending of the display 31 due to high hardness and stiffness. In other words, in the process of folding or unfolding the electronic device 100, the first buffer 324 can absorb stress generated during bending.

In addition, the first buffer 324 is disposed on the second surface 3224 of the third metal plate 322, so that when the electronic device 100 is in the unfolded state, the peripheral edges of the grooves or the through holes on the first support plate 41, the second support plate 42, and the third support plate 43 of the rotation apparatus 40 squeeze the first buffer 324. In this way, because the first buffer 324 has better flexibility, the first buffer 324 has sufficient flexibility to absorb a portion of squeezing force, so as to reduce force with which the peripheral edges of the through holes 3225 of the third metal plate 322 squeeze the display 31. Therefore, the problem such as the black spot or the bright line due to excessive squeezing is prevented, to a large degree, from occurring on the display 31.

In an implementation, the first buffer 324 is a single-sided adhesive tape. The first buffer 324 is bonded to a surface that is of the third metal plate 322 and that is away from the display 31. Because the first buffer 324 may be bonded, a manner of fastening the first buffer 324 to the third metal plate 322 is simple and easy to operate. In addition, compared with a solution in which the first buffer 324 is fastened to the third metal plate 322 through a fastener adhesive, the fastener adhesive is omitted in this implementation. Therefore, input costs of the support 32 can be reduced.

In a third embodiment, same content as that in the first embodiment is not described again. In other words, most content of the first embodiment may be directly applied to the third embodiment.

Figure 12:
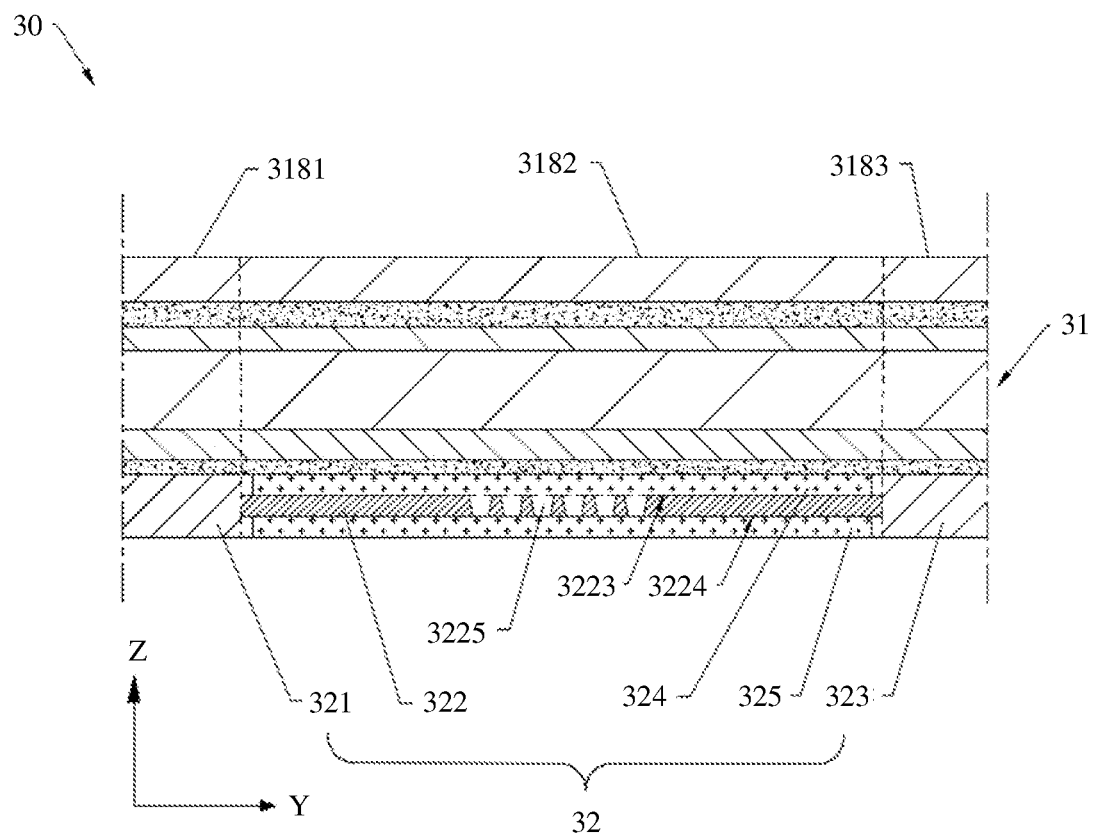
FIG. 12 is an A-A partial schematic sectional view of a still further implementation of a display module of the electronic device shown in FIG. 4.

FIG. 12 is an A-A partial schematic sectional view of still another implementation of a display module of the electronic device shown in FIG. 4. The support 32 further includes a second buffer 325. The second buffer 325 is fastened to the third metal plate 322, and the second buffer 325 and the first buffer 324 are disposed opposite to each other. In other words, when the first buffer 324 is fastened to the first surface 3223, the second buffer 325 is fastened to the second surface 3224. Alternatively, when the first buffer 324 is fastened to the second surface 3224, the second buffer 325 is fastened to the first surface 3223. An example in which the second buffer 325 is fastened to the second surface 3224 when the first buffer 324 is fastened to the first surface 3223 is used for description below.

A material of the second buffer 325 is the same as a material of the first buffer 324 in the first embodiment. Details are not described herein.

It may be understood that, the first buffer 324 is disposed on the first surface 3223 of the third metal plate 322, and the second buffer 325 is disposed on the second surface 3224 of the third metal plate 322. Therefore, flexibility of the support 32 disposed on the bending region 3182 facing the display 31 is significantly improved. In this case, in the process of unfolding or folding the electronic device 100, the support 32 disposed facing the bending region 3182 can reduce impact on the display 31 in the bending process. In other words, in the process of unfolding or folding the electronic device 100, the first buffer 324 and the second buffer 325 can jointly absorb stress generated during bending.

In addition, the first buffer 324 is disposed on the surface that is of the third metal plate 322 and that is close to the display 31, and the second buffer 325 is disposed on the surface that is of the third metal plate 322 and that is away from the display 31, so that when the electronic device 100 is in the unfolded state, the peripheral edges of the grooves or the through holes on the first support plate 41, the second support plate 42, and the third support plate 43 of the rotation apparatus 40 squeeze the second buffer 325. In this way, because the second buffer 325 has better flexibility, the second buffer 325 has sufficient flexibility to absorb a portion of squeezing force. In this case, the stress on the peripheral edges of the through holes 3225 of the third metal plate 322 is not concentrated, in other words, force with which the peripheral edges of the through holes 3225 of the third metal plate 322 squeeze the display 31 is small. Therefore, the problem such as the black spot or the bright line is prevented, to a large degree, from occurring on the display 31. In addition, when the second buffer 325 transfers a portion of the squeezing force to the first buffer 324 through the third metal plate 322, the first buffer 324 can also absorb a portion of the squeezing force again. In this case, large squeezing force exerted on the display 31 is further reduced. Therefore, the problem such as the black spot or the bright line is prevented, to a large degree, from occurring on the display 31.

The foregoing describes embodiments of three structures of the display module 30 by using related accompanying drawings. In the three embodiments, the third metal plate 322 is provided with the through holes 3225, so as to improve flexibility of the support 32. The following describes a fourth embodiment of the display module 30 by using related accompanying drawings.

Figure 13:
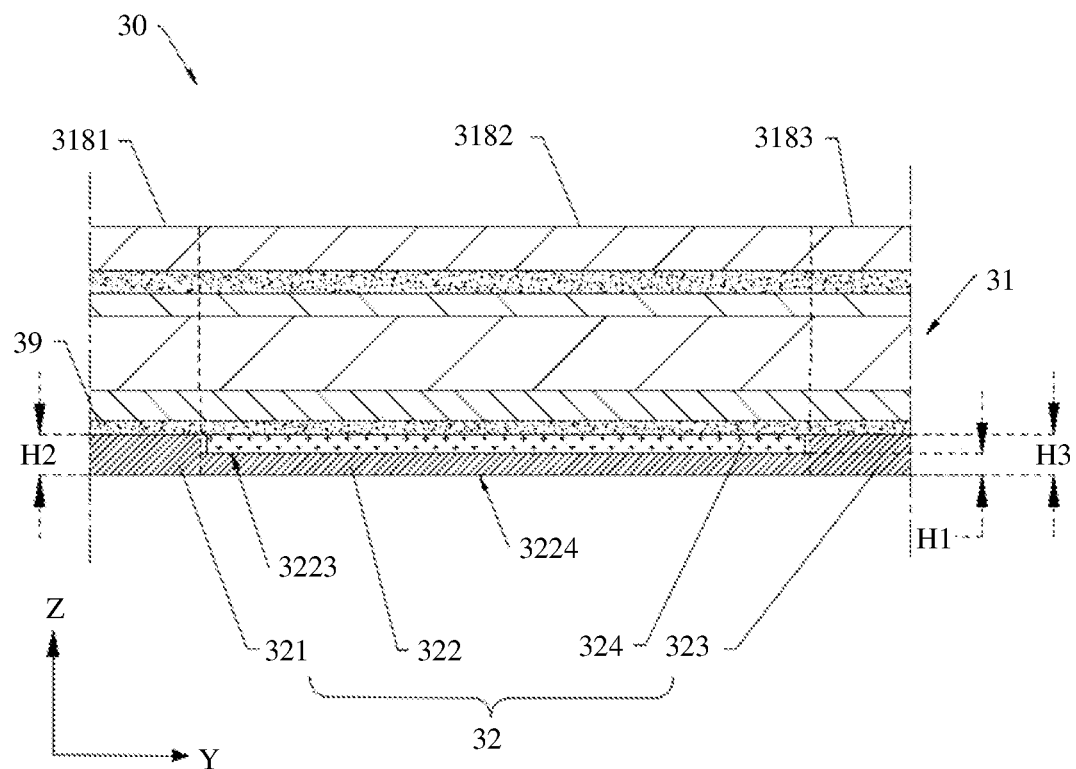
FIG. 13 is an A-A partial schematic sectional view of a yet further implementation of a display module of the electronic device shown in FIG. 4.

In the fourth embodiment, same content as that in the first embodiment is not described again. FIG. 13 is an A-A partial schematic sectional view of still another implementation of a display module of the electronic device shown in FIG. 4.

The support 32 includes a first buffer 324, and a first metal plate 321, a third metal plate 322, and a second metal plate 323 that are successively connected. In other words, the third metal plate 322 is connected between the first metal plate 321 and the second metal plate 323. The first buffer 324 is located between the first metal plate 321 and the second metal plate 323, and the first buffer 324 and the third metal plate 322 are disposed in a stacked manner. The first buffer 324 is fastened to the first surface 3223 of the third metal plate 322.

In addition, the first metal plate 321 is disposed facing the first bending region 3181. Both the third metal plate 322 and the first buffer 324 are disposed facing the bending region 3182. The second metal plate 323 is disposed facing the second non-bending region 3183. Both the third metal plate 322 and the first buffer 324 can be bent.

In addition, the third metal plate 322 is a continuous and complete plate. In other words, the third metal plate 322 is not provided with a through hole or a groove. In this case, the first surface 3223 of the third metal plate 322 is a flat surface. In the Z direction, namely, in a thickness direction of the display module 30, the height H1 of the third metal plate 322 ranges from 0.015 millimeter to 0.3 millimeter. For example, H1 is equal to 0.015 millimeter, 0.02 millimeter, 0.1 millimeter, 0.2 millimeter, or 0.3 millimeter. In the Z direction, a height H2 of the first metal plate 321 and a height H3 of the second metal plate 323 range from 0.1 millimeter to 0.5 millimeter. For example, H2 is equal to 0.1 millimeter, 0.2 millimeter, 0.25 millimeter, 0.3 millimeter, 0.4 millimeter, or 0.5 millimeter.

It may be understood that, compared with the support 32 in the first embodiment, the second embodiment, and the third embodiment, no through hole 3225 is disposed on the support 32 in this embodiment. In this implementation, the height H1 of the third metal plate 322 is set to be within a range from 0.015 millimeter to 0.3 millimeter, so that the third metal plate 322 has better flexibility. In this case, in the process of unfolding or folding the electronic device 100, internal stress of the third metal plate 322 is not concentrated, so that impact on bending of the display 31 is reduced.

In addition, the first buffer 324 is fastened to the first surface 3223. Therefore, when the peripheral edges of the grooves or the through holes on the first support plate 41, the second support plate 42, and the third support plate 43 squeeze the third metal plate 322, the third metal plate 322 transfers squeezing force to the first buffer 324. In this case, the first buffer 324 may absorb a portion of the squeezing force, to prevent the problem such as the black spot or the bright line due to excessive squeezing from occurring on the display 31.

In addition, when the peripheral edges of the grooves or the through holes on the first support plate 41, the second support plate 42, and the third support plate 43 squeeze the third metal plate 322, if the third metal plate 322 breaks, the peripheral edges squeeze towards the display 31. In this case, the first buffer 324 can also prevent the broken third metal plate 322 from directly piercing or squeezing towards the display 31. Therefore, the problem such as the black spot or the bright line is prevented, to a large degree, from occurring on the display 31.

In addition, in the Z direction, the height H2 of the first metal plate 321 and the height H3 of the second metal plate 323 range from 0.1 millimeter to 0.5 millimeter. In this way, the first metal plate 321 and the second metal plate 323 have sufficient hardness and stiffness, so that in the process of unfolding or folding the electronic device 100, the first metal plate 321 and the second metal plate 323 can effectively support the display 31. In addition, the first metal plate 321 and the second metal plate 323 in this size are thin, so that the first metal plate 321 and the second metal plate 323 do not increase the thickness of the display module 30 to a large degree either.

In this embodiment, for materials of the first metal plate 321, the third metal plate 322, the second metal plate 323, and the first buffer 324, refer to materials of the first metal plate 321, the third metal plate 322, the second metal plate 323, and the first buffer 324 in the first embodiment. Details are not described herein again.

Figure 14:
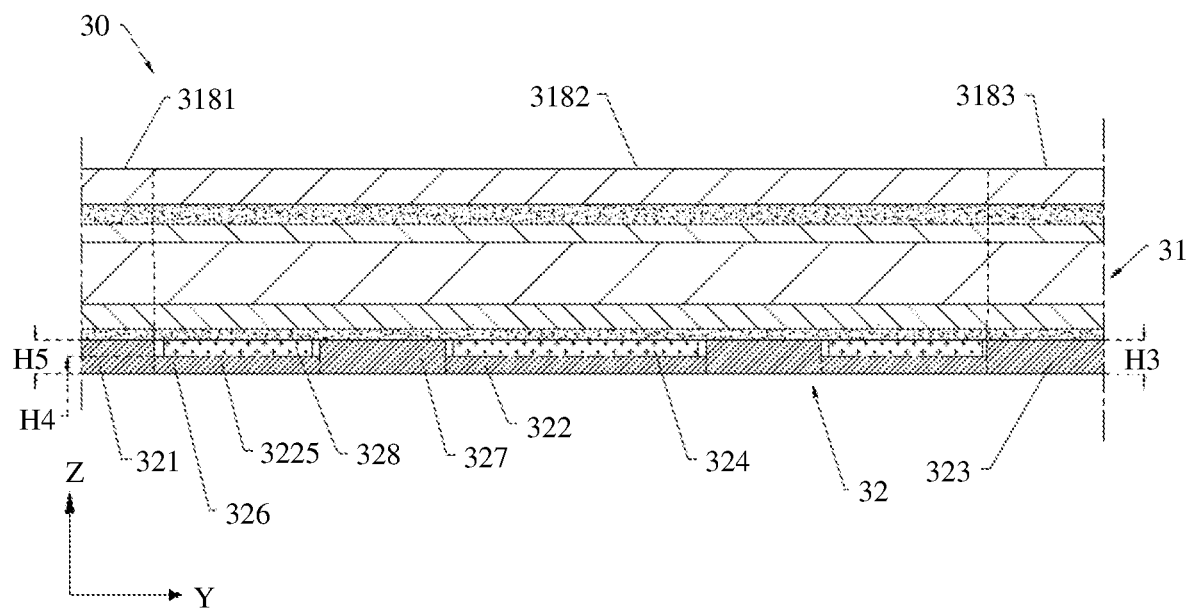
FIG. 14 is an A-A partial schematic sectional view of a still yet further implementation of a display module of the electronic device shown in FIG. 4.

FIG. 14 is an A-A partial schematic sectional view of still another implementation of a display module of the electronic device shown in FIG. 4. The support 32 further includes a fourth metal plate 326, a fifth metal plate 327, and a third buffer 328 that face the bending region 3182 of the display 31. The first metal plate 321, the fourth metal plate 326, the fifth metal plate 327, the third metal plate 322, and the second metal plate 323 are successively connected. The fourth metal plate 326 can be bent. The third buffer 328 is located between the first metal plate 321 and the fifth metal plate 327, and the third buffer 328 and the fourth metal plate 326 are disposed in a stacked manner. In an implementation, the third buffer 328 is fastened between the display 31 and the fourth metal plate 326. In the Z direction, a height H4 of the fourth metal plate 326 ranges from 0.015 millimeter to 0.3 millimeter. A height H5 of the fifth metal plate 327 ranges from 0.1 millimeter to 0.5 millimeter.

A material of the fourth metal plate 326 may be, but is not limited to, copper, aluminum, beryllium copper, stainless steel, a titanium alloy, or the like. A material of the fifth metal plate 327 may be, but is not limited to, copper, aluminum, beryllium copper, stainless steel, a titanium alloy, or the like. In addition, for a material and a formation manner of the third buffer 328, refer to the material and the formation manner of the first buffer 324 in the first embodiment. Details are not described herein again.

In this implementation, the fourth metal plate 326 is additionally disposed, so as to increase a quantity of regions with better flexibility of the support 32. In this way, when the support 32 is fastened to the display 31, the fourth metal plate 326 may be fastened to a region with a large bending angle in the bending region 3182 of the display 31, to ensure that the bending region 3182 of the display 31 has a better bending effect.

In another implementation, the support 32 may further include a sixth metal plate, ..., and an $S^{th}$ metal plate. S is an integer greater than 6. The $S^{th}$ metal plate includes at least one metal plate whose height ranges from 0.015 millimeter to 0.3 millimeter in the Z direction. In addition, the $S^{th}$ metal plate includes at least one metal plate whose height ranges from 0.1 millimeter to 0.5 millimeter in the Z direction.

In addition, the support 32 may further include a fifth buffer, ..., and a $P^{th}$ buffer. P is an integer greater than 5. The $P^{th}$ buffer is fastened to a surface of a metal plate whose height ranges from 0.015 mm to 0.3 mm.

In another embodiment, for a disposition manner of the first buffer 324, refer to the disposition manner of the first buffer 324 in the second embodiment: The first buffer 324 is fastened to a surface that is of the third metal plate 322 and that is away from the display 31. Details are not described herein again.

In another embodiment, the support 32 may also include a second buffer 325. For a disposition manner of the second buffer 325, refer to the disposition manner of the second buffer 325 in the third embodiment. Details are not described herein again.

Figure 15:
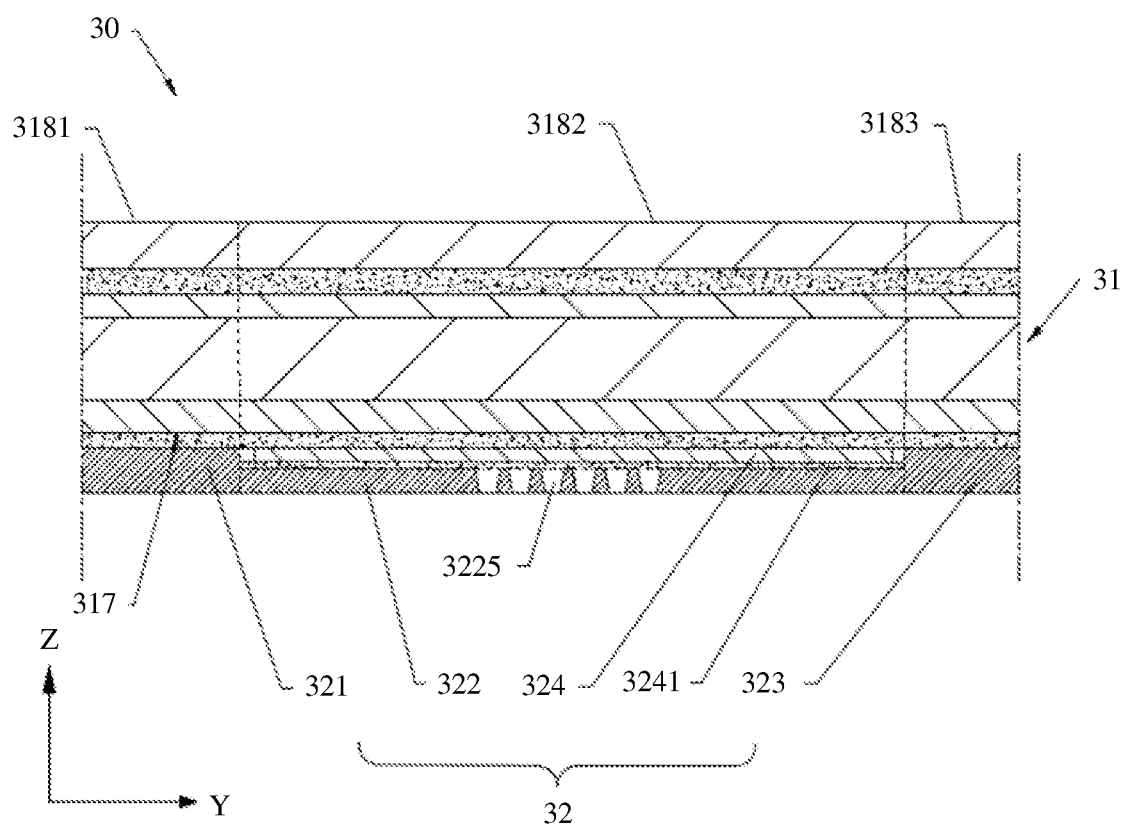
FIG. 15 is an A-A partial schematic sectional view of an even yet another implementation of a display module of the electronic device shown in FIG. 4.

In a fifth embodiment, same content as that in the first embodiment is not described again. FIG. 15 is an A-A partial schematic sectional view of still another implementation of a display module of the electronic device shown in FIG. 4. In this embodiment, the support 32 no longer includes the first buffer 324. The support 32 includes a metal sheet 324. The metal sheet 324 is located between the first metal plate 321 and the second metal plate 323, and the metal sheet 324 and the third metal plate 322 are disposed in a stacked manner. In this implementation, the first buffer 324 is fastened between the third metal plate 322 and the display 31. In another embodiment, the metal sheet 324 is fastened to a surface that is of the third metal plate 322 and that is away from the display 31.

A material of the metal sheet 324 may be but is not limited to copper, aluminum, beryllium copper, stainless steel, a titanium alloy, or the like. The support plate 32 further includes an adhesive tape 3241. The adhesive tape 3241 is fastened between the metal sheet 324 and the third metal plate 322. In other words, the metal sheet 324 is connected between the third metal plate 322 and the display 31 by using the adhesive tape 3241. It may be understood that the adhesive tape 3241 is considered as, but is not limited to, a double-sided tape or foam adhesive. The adhesive tape 3241 covers the through hole 3225.

Specifically, when the first metal plate 321, the third metal plate 322, and the second metal plate 323 that have an integrally formed structure are processed, and the third metal plate 322 is provided with the through holes 3225, the metal sheet 324 is fastened, by using the adhesive tape 3241, to the surface of the third metal plate 322 facing the display 31. In this case, the first metal plate 321, the third metal plate 322, the second metal plate 323, and the metal sheet 324 are integrated as a whole.

It may be understood that when the peripheral edges of the grooves or the through holes on the first support plate 41, the second support plate 42, and the third support plate 43 squeeze the third metal plate 322, the third metal plate 322 transfers squeezing force to the metal sheet 324. In this case, because the metal sheet 324 has better integrity, it is not easy for the metal sheet 324 to pierce or squeeze the display 31 because the metal sheet 324 breaks. Therefore, the problem such as the black spot or the bright line is prevented, to a large degree, from occurring on the display 31.

In addition, when the peripheral edges of the grooves or the through holes on the first support plate 41, the second support plate 42, and the third support plate 43 squeeze the third metal plate 322, if the third metal plate 322 breaks, the peripheral edges squeeze towards the display 31. In this case, because the metal sheet 324 is disposed between the third metal plate 322 and the display 31, the metal sheet 324 can prevent the third metal plate 322 from directly piercing or squeezing the display 31. Therefore, the problem such as the black spot or the bright line is prevented, to a large degree, from occurring on the display 31.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A display module, comprising:
    a display, comprising a first non-bending region, a bending region, and a second non-bending region that are successively connected; and
    a support fastened to a non-display side of the display, wherein the support comprises a first metal plate, a third metal plate, and a second metal plate that are successively connected, the first metal plate is disposed facing the first non-bending region, the second metal plate is disposed facing the second non-bending region, the third metal plate is disposed facing the bending region, and the third metal plate is bendable; and
    wherein the support further comprises a first buffer, the first buffer is located between the first metal plate and the second metal plate, the first buffer and the third metal plate are disposed in a stacked manner, a plurality of through holes penetrate through the third metal plate in a thickness direction of the display module, and the plurality of through holes are hollow;
    wherein the support further comprises a fourth metal plate, a fifth metal plate, and a third buffer, wherein the fifth metal plate, the fourth metal plate, the first metal plate, the third metal plate, and the second metal plate are successively connected, the fourth metal plate is bendable, a first through hole extends through the fourth metal plate, and the third metal plate and the fourth metal plate are connected to opposite sides of the first metal plate; and
    wherein the third buffer is located between the first metal plate and the fifth metal plate, and the third buffer and the fourth metal plate are disposed in a stacked manner;
    wherein the first buffer is an adhesive tape, and the first buffer is bonded to a surface of the third metal plate that faces the display; and
    wherein a first sidewall of the first buffer that is farthest from the second metal plate is connected to a sidewall of the first metal plate, and a second sidewall of the first buffer that is farthest from the first metal plate is connected to a sidewall of the second metal plate, and the first sidewall of the first buffer and the second sidewall of the first buffer are perpendicular to a major surface of the display.

2. The display module according to claim 1, wherein the support further comprises a second buffer, and the second buffer is fastened to a surface of the third metal plate that faces away from the first buffer.

3. The display module according to claim 1, wherein the plurality of through holes are comprised in a plurality of first through hole groups, the plurality of first through hole groups are arranged in a first direction, each first through hole group comprises a plurality of first through holes, a plurality of first through holes in a same first through hole group are arranged at intervals in a second direction, a plurality of first through holes in two adjacent first through hole groups are arranged to overlap partly with each other, the second direction is a direction in which the first metal plate faces the second metal plate, and the first direction is perpendicular to the second direction.

4. The display module according to claim 3, wherein at least one of the first through holes is a strip-shaped hole, an extension direction of the at least one of the first through holes is parallel to the first direction, and in the second direction, a width of the at least one of the first through holes ranges from 0.15 millimeter to 3 millimeters.

5. The display module according to claim 4, wherein in the second direction, a distance between two adjacent first through holes in a same first through hole group ranges from 0.05 millimeter to 0.8 millimeter.

6. A display module, comprising:
    a display, comprising a first non-bending region, a bending region, and a second non-bending region that are successively connected; and
    a support is fastened to a non-display side of the display, wherein the support comprises a first metal plate, a third metal plate, and a second metal plate that are successively connected, the first metal plate is disposed facing the first non-bending region, the second metal plate is disposed facing the second non-bending region, and the third metal plate is disposed facing the bending region;
    wherein the third metal plate is a continuous and complete plate and has no holes in any portion that is between a first sidewall of the third metal plate that is closest to the first metal plate and a second sidewall of the third metal plate that is closest to the second metal plate, and the third metal plate is bendable;
    wherein in a thickness direction of the display module, a height of the third metal plate ranges from 0.015 millimeter to 0.3 millimeter, and a height of the first metal plate and a height of the second metal plate range from 0.1 millimeter to 0.5 millimeter; and
    wherein the support further comprises a first buffer, and the first buffer is located between the first metal plate and the second metal plate, and the first buffer and the third metal plate are disposed in a stacked manner; and
    wherein the first buffer is an adhesive tape, and the first buffer is bonded to a surface of the third metal plate that faces the display; and
    wherein a first sidewall of the first buffer that is farthest from the second metal plate is connected to a sidewall of the first metal plate, and a second sidewall of the first buffer that is farthest from the first metal plate is connected to a sidewall of the second metal plate, and the first sidewall of the first buffer and the second sidewall of the first buffer are perpendicular to a major surface of the display.

7. The display module according to claim 6, wherein the support further comprises a second buffer, and the second buffer is fastened to a surface of the third metal plate that faces away from the first buffer.

8. The display module according to claim 6, wherein the support further comprises a fourth metal plate, a fifth metal plate, and a third buffer that face the bending region of the display, and wherein the fifth metal plate, the fourth metal plate, the first metal plate, the third metal plate, and the second metal plate are successively connected, and the fourth metal plate is bendable;
wherein in the thickness direction of the display module, a height of the fourth metal plate ranges from 0.015 millimeter to 0.3 millimeter, and a height of the fifth metal plate ranges from 0.1 millimeter to 0.5 millimeter; and
wherein the third buffer is located between the first metal plate and the fifth metal plate, and the third buffer and the fourth metal plate are disposed in a stacked manner.

9. An electronic device, comprising:
a housing; and
the display module according to claim 6 mounted in the housing.

10. An electronic device, comprising:
a housing; and
a display module mounted in the housing, wherein the display module comprises:
a display, comprising a first non-bending region, a bending region, and a second non-bending region that are successively connected; and
a support fastened to a non-display side of the display, wherein the support comprises a first metal plate, a third metal plate, and a second metal plate that are successively connected, the first metal plate is disposed facing the first non-bending region, the second metal plate is disposed facing the second non-bending region, the third metal plate is disposed facing the bending region, and the third metal plate is bendable; and
wherein the support further comprises a first buffer, the first buffer is located between the first metal plate and the second metal plate, the first buffer and the third metal plate are disposed in a stacked manner, a plurality of through holes penetrate through the third metal plate in a thickness direction of the display module, and the plurality of through holes are hollow;
wherein the support further comprises a fourth metal plate, a fifth metal plate, and a third buffer, and wherein the fifth metal plate, the fourth metal plate, the first metal plate, the third metal plate, and the second metal plate are successively connected, the fourth metal plate is bendable, a first through hole extends through the fourth metal plate, and the third metal plate and the fourth metal plate are connected to opposite sides of the first metal plate;
wherein the third buffer is located between the first metal plate and the fifth metal plate, and the third buffer and the fourth metal plate are disposed in a stacked manner;
wherein the first buffer is an adhesive tape, and the first buffer is bonded to a surface of the third metal plate that faces the display; and
wherein a first sidewall of the first buffer that is farthest from the second metal plate is connected to a sidewall of the first metal plate, and a second sidewall of the first buffer that is farthest from the first metal plate is connected to a sidewall of the second metal plate, and the first sidewall of the first buffer and the second sidewall of the first buffer are perpendicular to a major surface of the display.

11. The display module according to claim 10, wherein the support further comprises a second buffer, and the second buffer is fastened to a surface of the third metal plate that faces away from the first buffer.

12. The display module according to claim 10, wherein the plurality of through holes are comprised in a plurality of first through hole groups, the plurality of first through hole groups are arranged in a first direction, each first through hole group comprises a plurality of first through holes, a plurality of first through holes in a same first through hole group are arranged at intervals in a second direction, a plurality of first through holes in two adjacent first through hole groups are arranged to overlap partly with each other, the second direction is a direction in which the first metal plate faces the second metal plate, and the first direction is perpendicular to the second direction.

* * * * *